(12) United States Patent
Pavlacka

(10) Patent No.: US 10,410,510 B2
(45) Date of Patent: Sep. 10, 2019

(54) HAZARDOUS DETECTION CALL POINT STATIONS

(71) Applicant: Federal Signal Corporation, Oak Brook, IL (US)

(72) Inventor: Myron Pavlacka, Frankfort, IL (US)

(73) Assignee: Federal Signal Corporation, Oak Brook, IL (US)

( * ) Notice: Subject to any disclaimer, the term of this patent is extended or adjusted under 35 U.S.C. 154(b) by 0 days.

(21) Appl. No.: 15/967,916

(22) Filed: May 1, 2018

(65) Prior Publication Data

US 2018/0315297 A1 Nov. 1, 2018

Related U.S. Application Data

(60) Provisional application No. 62/492,452, filed on May 1, 2017.

(51) Int. Cl.
| | | |
|---|---|---|
| *G08B 25/12* | (2006.01) | |
| *G08B 25/00* | (2006.01) | |
| *H05K 5/03* | (2006.01) | |
| *H05K 5/02* | (2006.01) | |
| *H05K 5/00* | (2006.01) | |
| *G08B 25/08* | (2006.01) | |

(52) U.S. Cl.
CPC .......... *G08B 25/12* (2013.01); *G08B 25/008* (2013.01); *G08B 25/08* (2013.01); *H05K 5/0008* (2013.01); *H05K 5/0217* (2013.01); *H05K 5/03* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,715,743 A | * | 2/1973 | Denton ................. | G08B 25/12 200/61.08 |
| 4,280,120 A | * | 7/1981 | Trafford ................ | G08B 25/12 340/303 |
| 6,380,846 B1 | * | 4/2002 | Hohlfelder ............ | G08B 25/12 200/43.07 |
| 9,886,832 B2 | * | 2/2018 | Pavlacka ................. | G08B 5/36 |

(Continued)

FOREIGN PATENT DOCUMENTS

| | | | | | |
|---|---|---|---|---|---|
| GB | 2075265 A | * | 11/1981 | ............ | G08B 25/12 |
| GB | 2430554 A | * | 3/2007 | ............ | G08B 25/12 |

OTHER PUBLICATIONS 1-24-090, "BExCP3A-PT/BExCP38B-PT Tool Reset Call Point" datasheet, E2S Warning Signals sales@e2s.com www.e2s.com, 2 pages, admitted prior art as of the earliest effectve filing date of the present patent application.

(Continued)

*Primary Examiner* — Travis R Hunnings
(74) *Attorney, Agent, or Firm* — Merchant & Gould P.C.

(57) ABSTRACT

An example hazardous detection call point station can include: a common rear housing; a front housing, wherein the common rear housing and the front housing are configured to be coupled to form a housing defining an interior; and an actuator cylinder positioned at least partially within the interior; wherein, upon breaking a glass front or depressing a button of the station, the actuator cylinder is biased to rotate to complete a circuit and thereby send an alarm notification to a main panel at a remote location.

18 Claims, 27 Drawing Sheets

(56) References Cited

U.S. PATENT DOCUMENTS

2003/0076216 A1* 4/2003 Pfenninger ............ G08B 25/12
337/401
2017/0084166 A1* 3/2017 McNutt .................. G08B 25/12

OTHER PUBLICATIONS 1-24-080, "BExCP3A-PB/BExCP3B-PB Push Button Call Point" datasheet, E2S Warning Signals sales@e2s.com www.e2s.com, 2 pages, admitted prior art as of the earliest effective filing date of the present patent application.

1-24-070, "BExCP3A-BG/BExCP3B-BG Break Glass Call Point" datasheet, E2S Warning Signals sales@e2s.com www.e2s.com, 2 pages, admitted prior art as of the earliest effective filng date of the present patent application.

1-24-060, "GNExCP6B-PT Tool Reset" datasheet, E2S Warning Signals sales@e2s.com www.e2s.com, 2 pages, admitted prior art as of the earliest effective filing date of the present patent application.

1-24-050, "GNExCP6A-PT Tool Reset" datasheet, E2S Warning Signals sales@e2s.com www.e2s.com, 2 pages, admitted prior art as of the earliest effective filing date of the present patent application.

1-24-040, "GNExCP6B-PB Push Button" datasheet, E2S Warning Signals sales@e2s.com www.e2s.com, 2 pages, admitted prior art as of the earliest effective filing date of the present patent application.

1-24-030, "GNExCP6A-PB Push Button" datasheet, E2S Warning Signals sales@e2s.com www.e2s.com, 2 pages, admitted prior art as of the earliest effective filing date of the present patent application.

1-24-020, "GNExCP6B-BG Break Glass" datasheet, E2S Warning Signals sales@e2s.com www.e2s.com, 2 pages, admitted prior art as of the earliest effective filing date of the present patent application.

1-24-010, "GNExCP6A-BG Break Glass" datasheet, E2S Warning Signals sales@e2s.com www.e2s.com, 2 pages, admitted prior art as of the earliest effective filing date of the present patent application.

Clifford&Snell, "Flameproof Manual Call Points," Series MCP, Signalling Devices datasheet, www.stahl.de, Apr. 29, 2015 EK00 III en, 5 pages.

e2S warning signals, "BExCP3B-PT Manual Call Point—Tool Reset With Resistor Modules" Instruction Manual, European Safety Systems Ltd. Impress House, Mansell Road, Acton, London W3 7QH, Document D150-00-251-IS, Issue 2, Jul. 1, 2013, 4 pages.

E2S warning signals, "BExCP3A-PT Manual Call Point—Tool Reset" Instruction Manual, European Safety Systems Ltd. Impress House, Mansell Road, Acton, London W3 7QH, Document D150-00-201-IS, Issue 1, Jun. 6, 2012, 3 pages.

E2S warning signals, "BExCP3B-PB Manual Call Point—Push Button With resistor Modules" Instruction Manual, European Safety Systems Ltd. Impress House, Mansell Road, Acton, London W3 7QH, Document D150-00-151-IS, Issue 2, Jul. 1, 2013, 4 pages.

E2S warning signals, "BExCP3A-PB Manual Call Point—Push Button" Instruction Manual, European Safety Systems Ltd. Impress House, Mansell Road, Acton, London W3 7QH, Document D150-00-101-IS, Issue 1, Jun. 6, 2012, 3 pages.

Crouse-Hinds by Eaton, PB Range—Alarm Call Points, "Hazardous areas, Weatherproof" datasheet, www.medc.com, Feb. 2015, 2 pages.

Crouse-Hinds by Eaton, PB Range—Manual Call Points, "Ex de, Intrinsically Safe (Ex ia), Weatherproof PB Range" datasheet, www.medc.com, Aug. 2014, 2 pages.

Crouse-Hinds by Eaton, BG Range—Fire Alarm Call Points, "Hazardous Location, Weatherproof" datasheet, www.medc.com, Feb. 2015, 2 pages.

Crouse-Hinds by Eaton, PB Range—Manual Call Points, "Ex de, Intrinsically Safe (Ex ia), Weatherproof PB Range" datasheet, www.medc.com, Feb. 2015, 2 pages.

Crouse-Hinds by Eaton, BG3 Range—Manual Call Point, "Intrinsically Safe (Exia), Weatherpfoof" datasheet, www.medc.com, Oct. 2014, 2 pages.

Crouse-Hinds by Eaton, BG2 Range—Manual Call Point, "Ex de, Intrinsically Safe (Ex ia), Weatherproof" datasheet, www.medc.com, Jun. 2014, 2 pages.

* cited by examiner

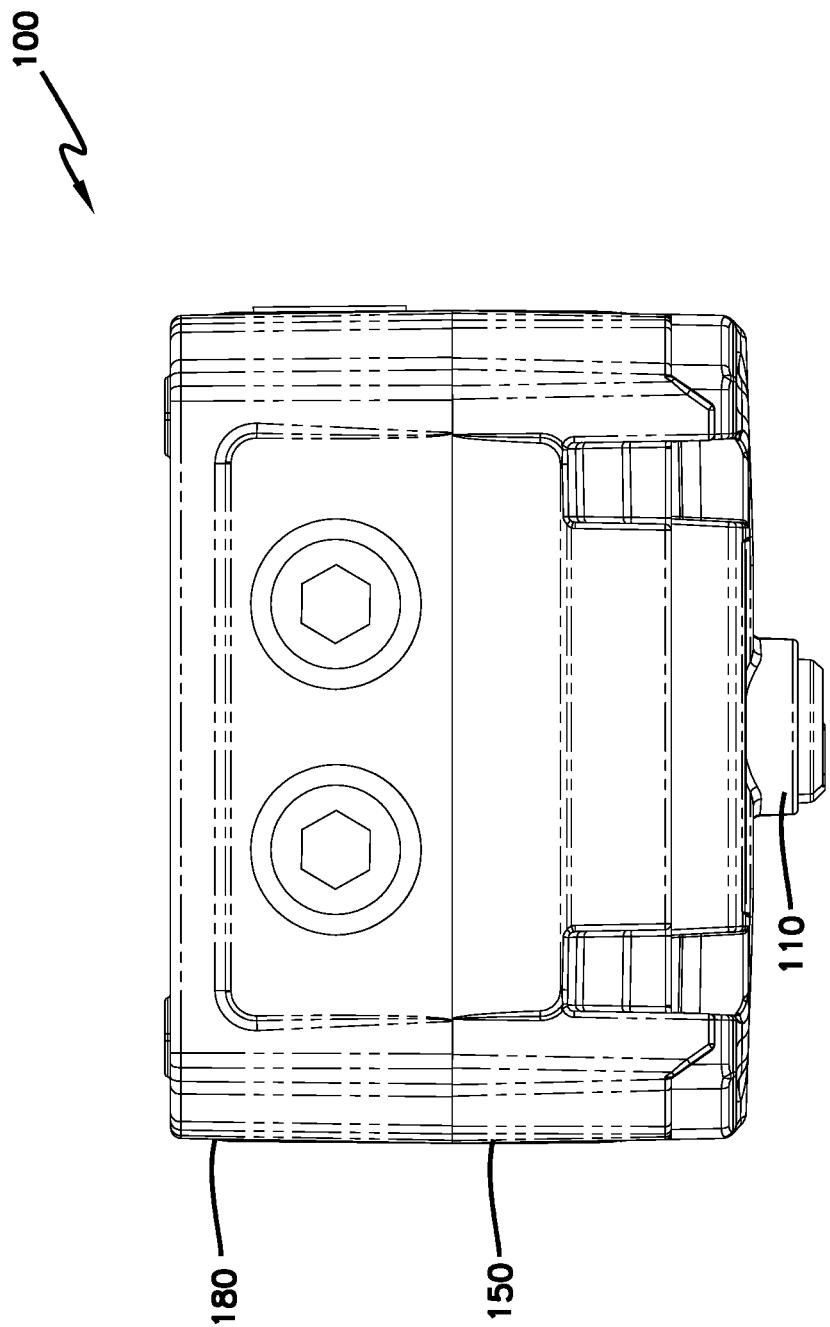

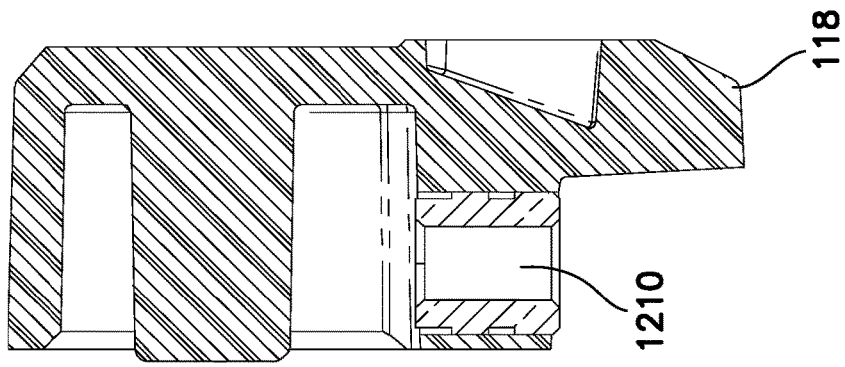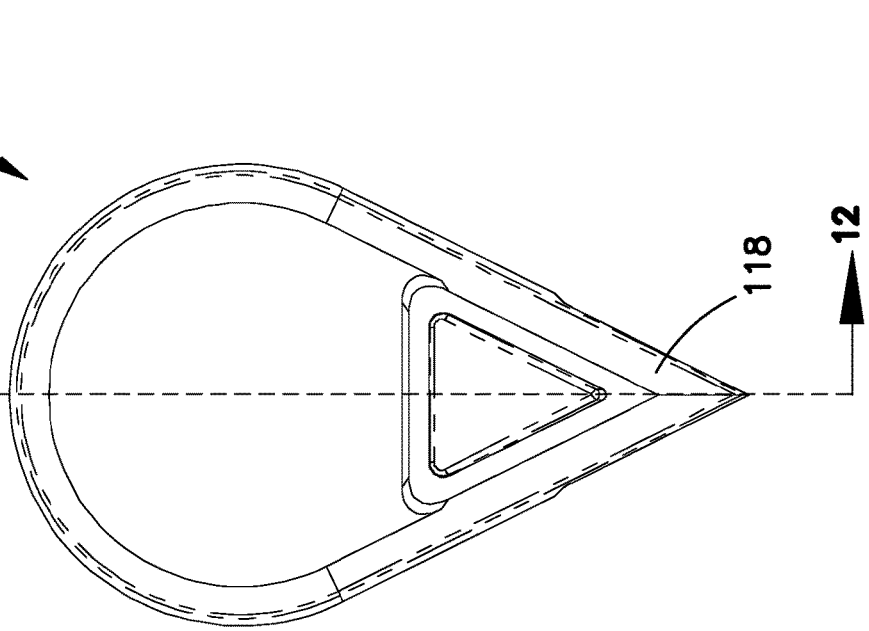

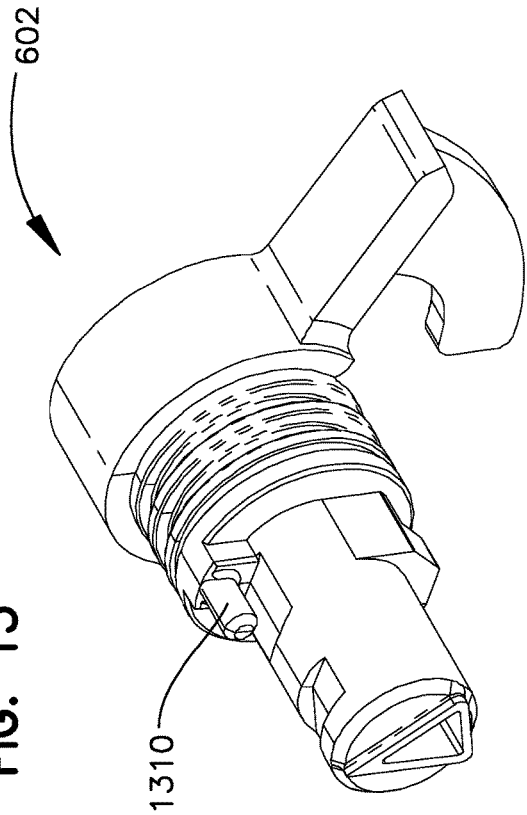
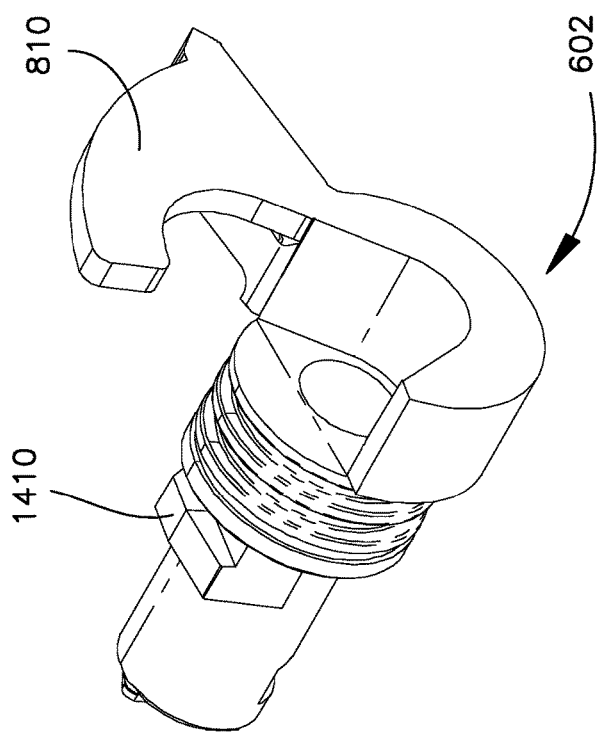
FIG. 13
FIG. 14

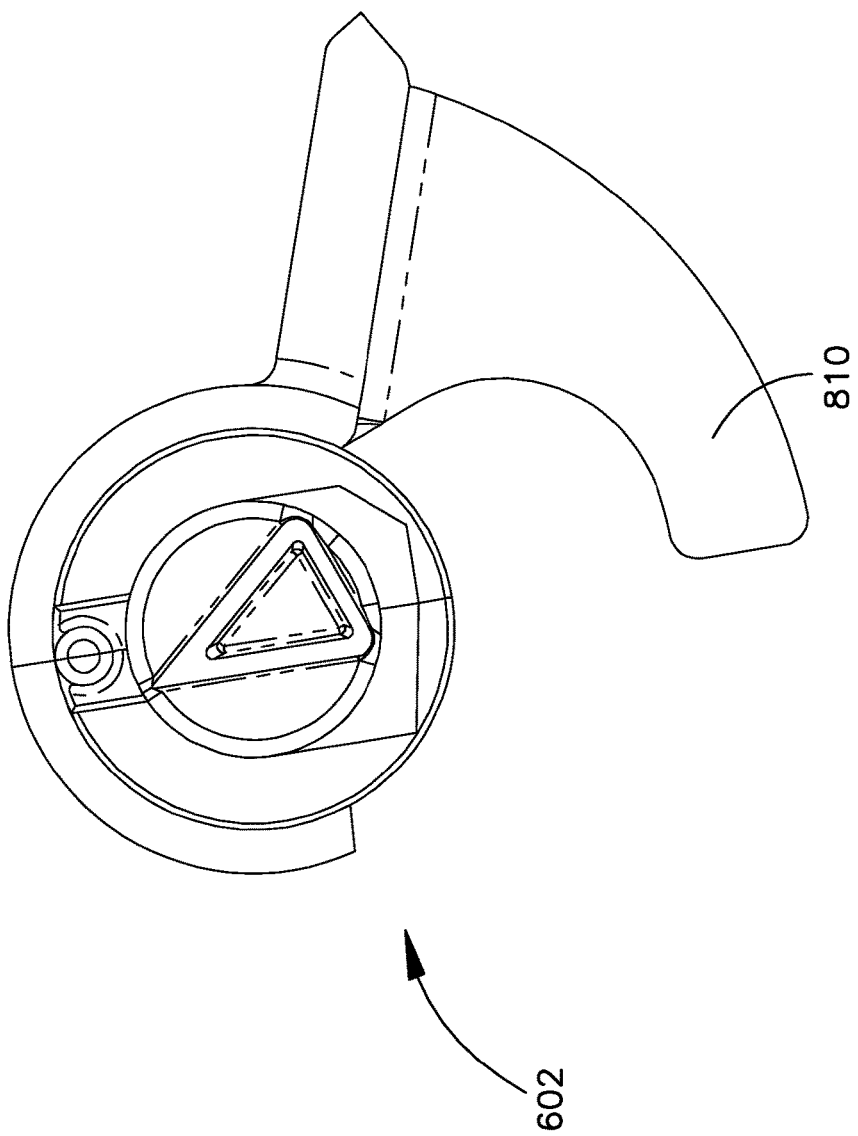

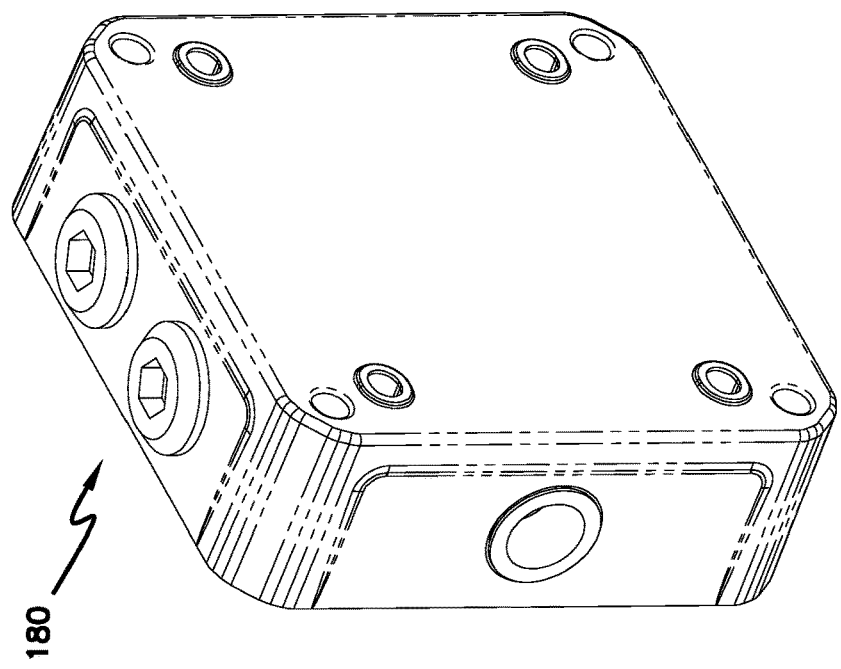
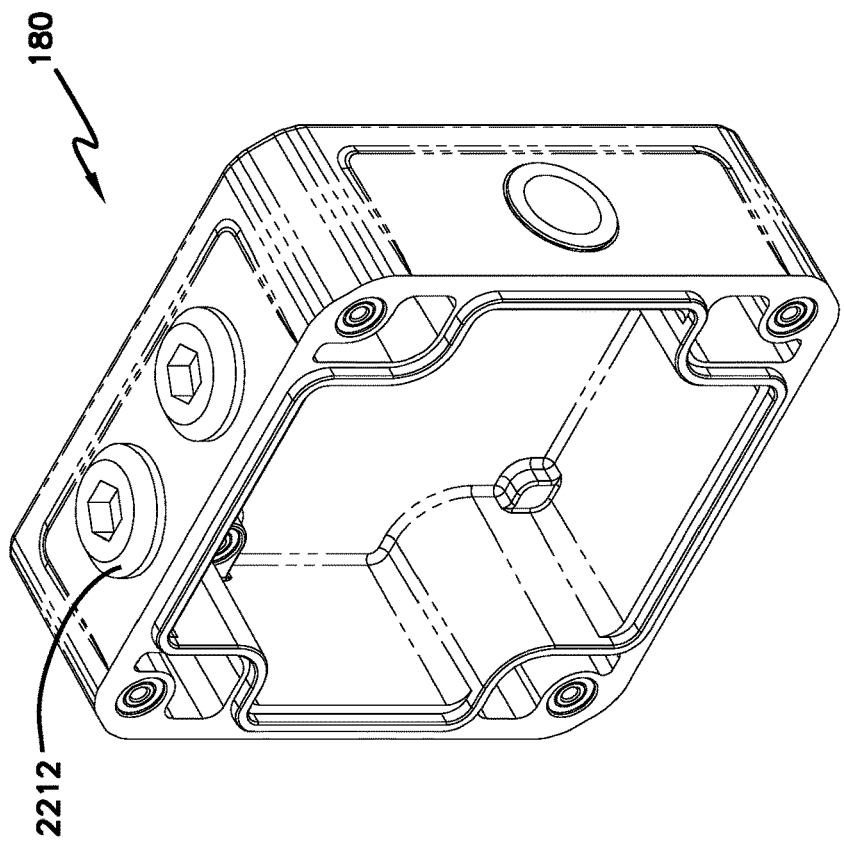

HAZARDOUS DETECTION CALL POINT STATIONS

BACKGROUND

Some manufacturing and other locations can be subject to the potential for fire and explosion due to flammable gases and hazardous materials. These areas are typically equipped with alarms to alert personnel when hazardous conditions are present. Some of these alarms are designed to be manually actuated by a person, such as by pressing a button or otherwise actuating the alarm.

SUMMARY

In one aspect, an example hazardous detection call point station can include: a common rear housing; a front housing, wherein the common rear housing and the front housing are configured to be coupled to form a housing defining an interior; and an actuator cylinder positioned at least partially within the interior; wherein, upon breaking a glass front or depressing a button of the station, the actuator cylinder is biased to rotate to complete a circuit and thereby send an alarm notification to a main panel at a remote location.

DESCRIPTION OF THE FIGURES

FIG. 5 shows another view of the example station of FIG. 1.

FIG. 11 shows an example keyway member of the station of FIG. 1.

FIG. 12 shows another view of the example keyway member of FIG. 11.

FIG. 13 shows an example actuator cylinder of the station of FIG. 1.

FIG. 14 shows another view of the example actuator cylinder of FIG. 13.

FIG. 15 shows another view of the example actuator cylinder of FIG. 13.

FIG. 18 shows an example rear housing of the station of FIG. 1.

FIG. 19 shows another view of the example rear housing of FIG. 18.

DETAILED DESCRIPTION

The present disclosure is directed to hazardous detection call point stations that are used to provide for the manual activation of an alarm by an operator when a hazardous condition occurs.

FIGS. 1-22 illustrate a first embodiment of a hazardous detection call point station 100. The station 100 is formed of a front housing 150 (see FIGS. 1-17) that is coupled to a rear housing 180 (see FIGS. 18-23C).

Figure 1:
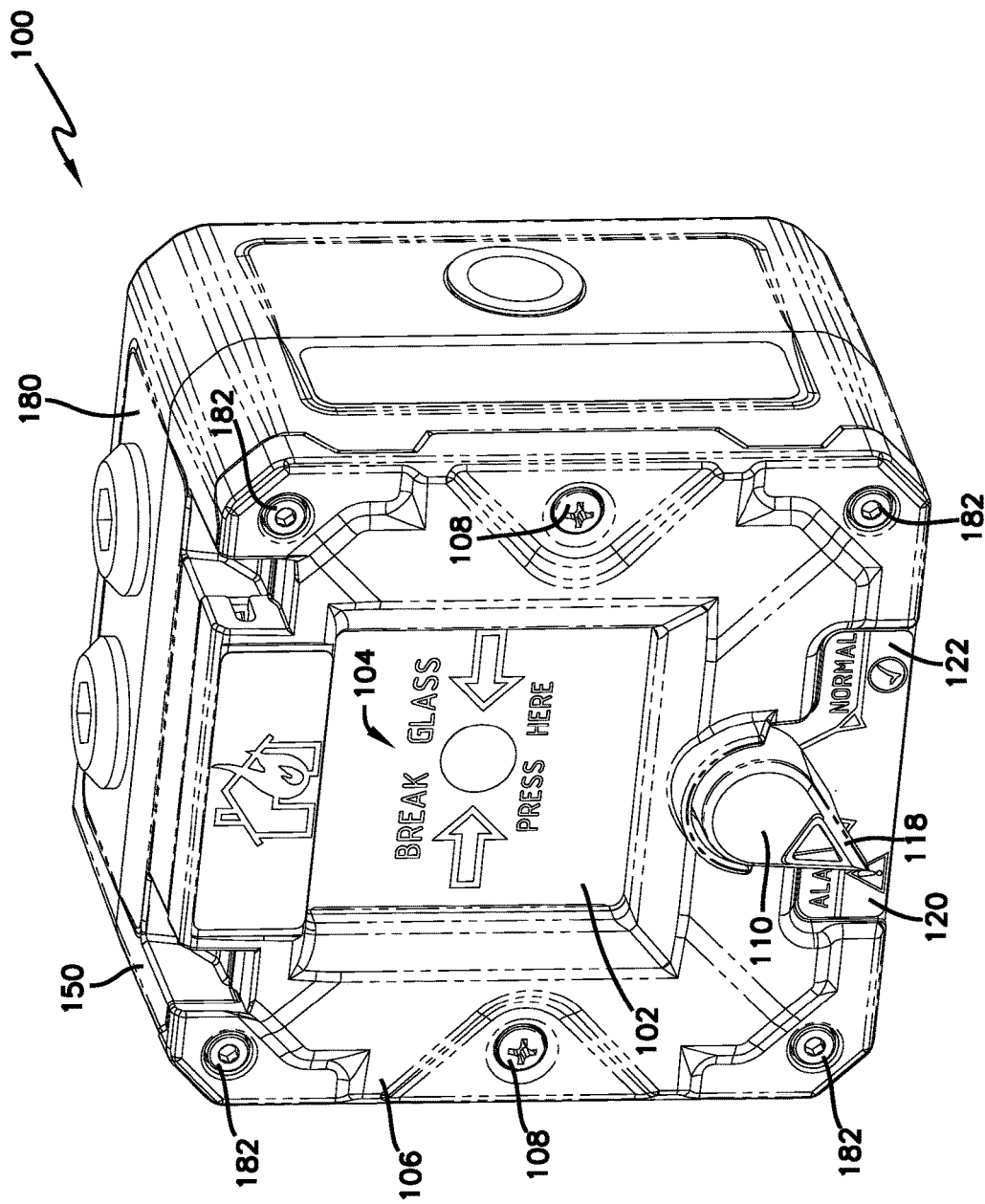
FIG. 1 shows a first example hazardous detection call point station.
Figure 2:
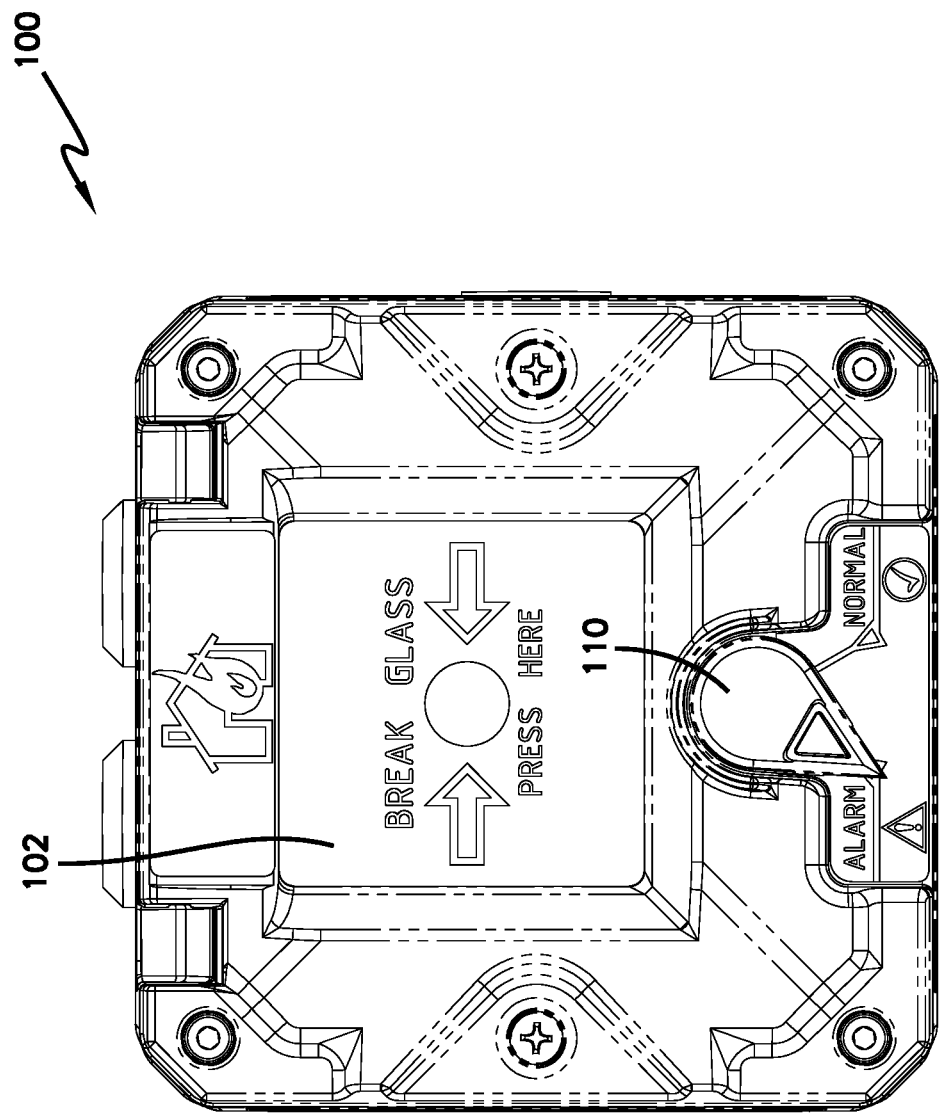
FIG. 2 shows another view of the example station of FIG. 1.
Figure 3:
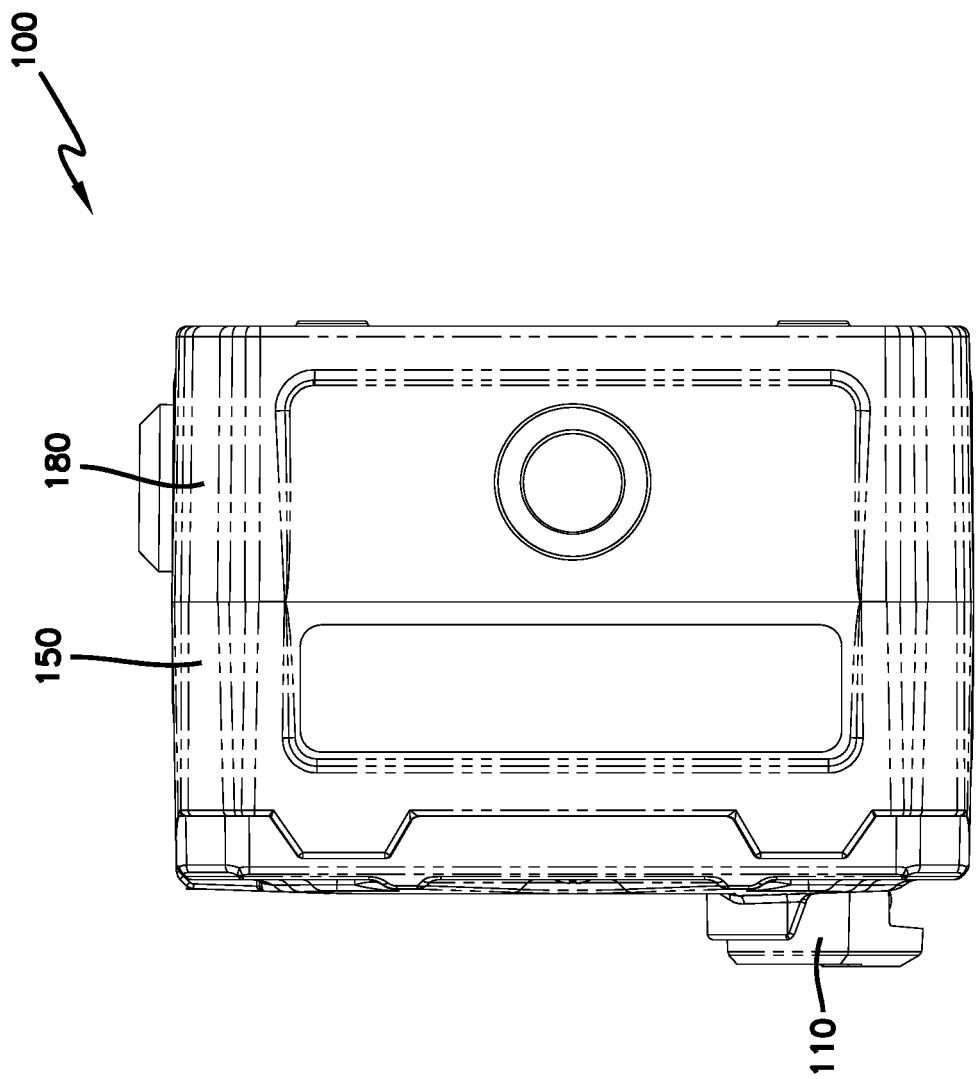
FIG. 3 shows another view of the example station of FIG. 1.
Figure 4:
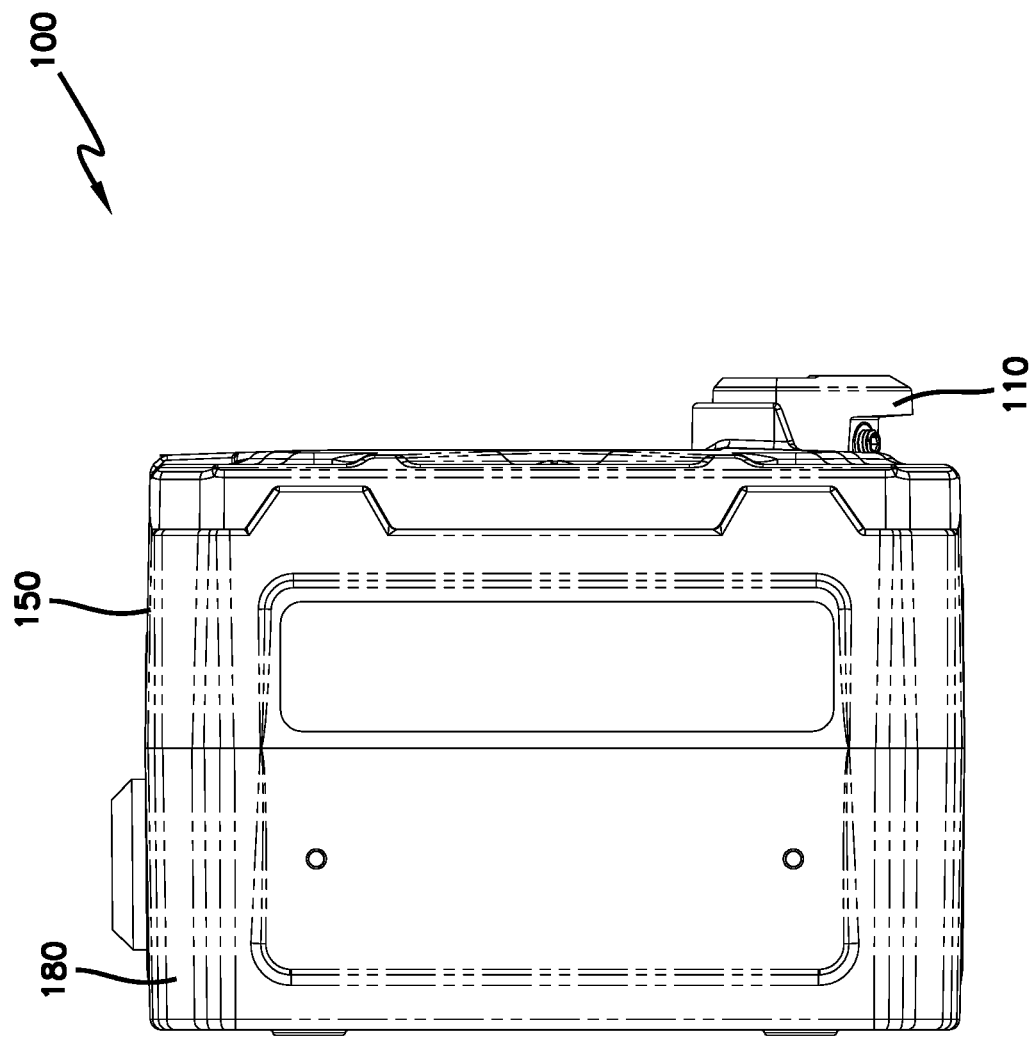
FIG. 4 shows another view of the example station of FIG. 1.
Figure 6A:
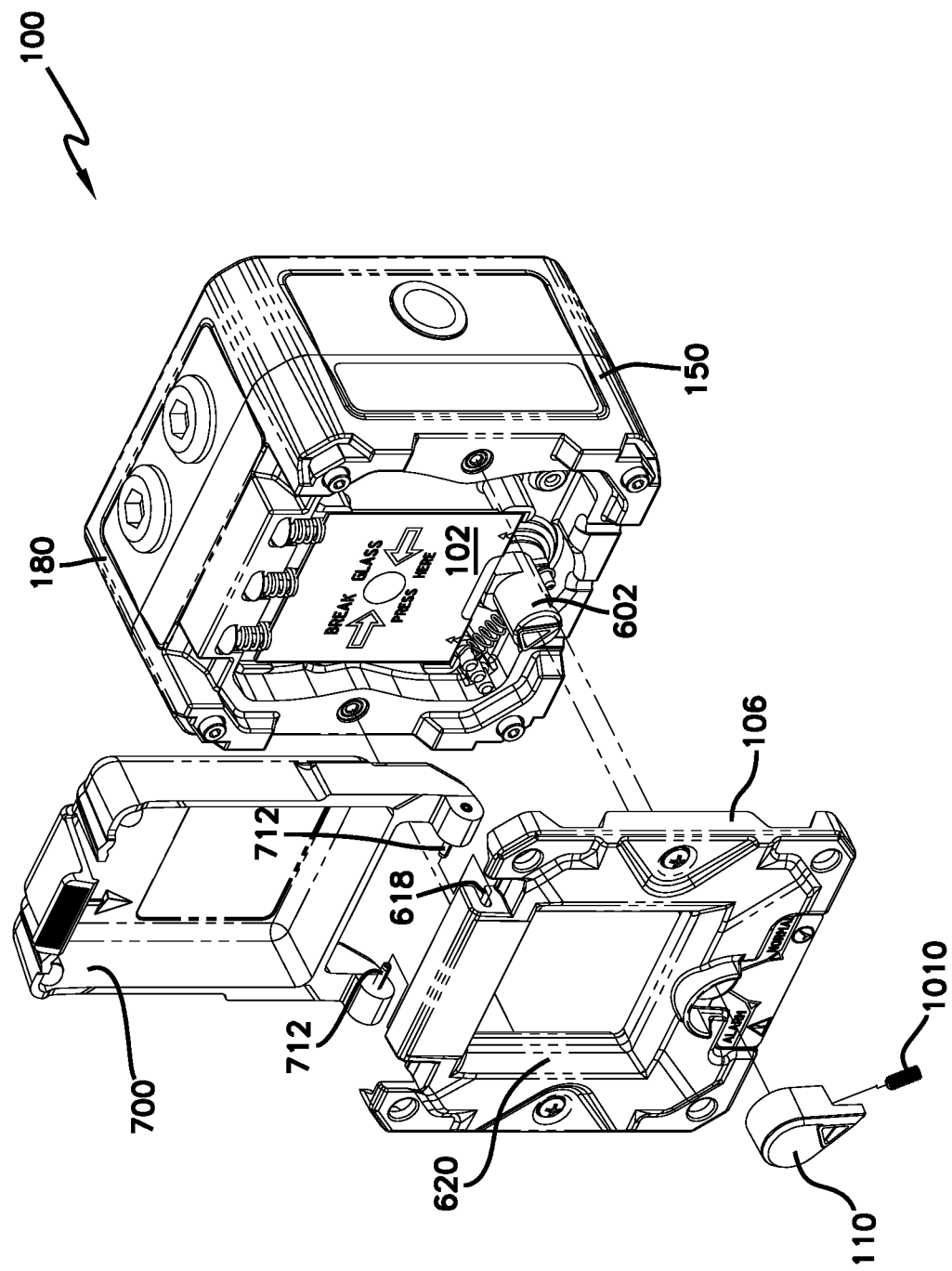
FIG. 6A shows a partial exploded view of the example station of FIG. 1.
Figure 6C:
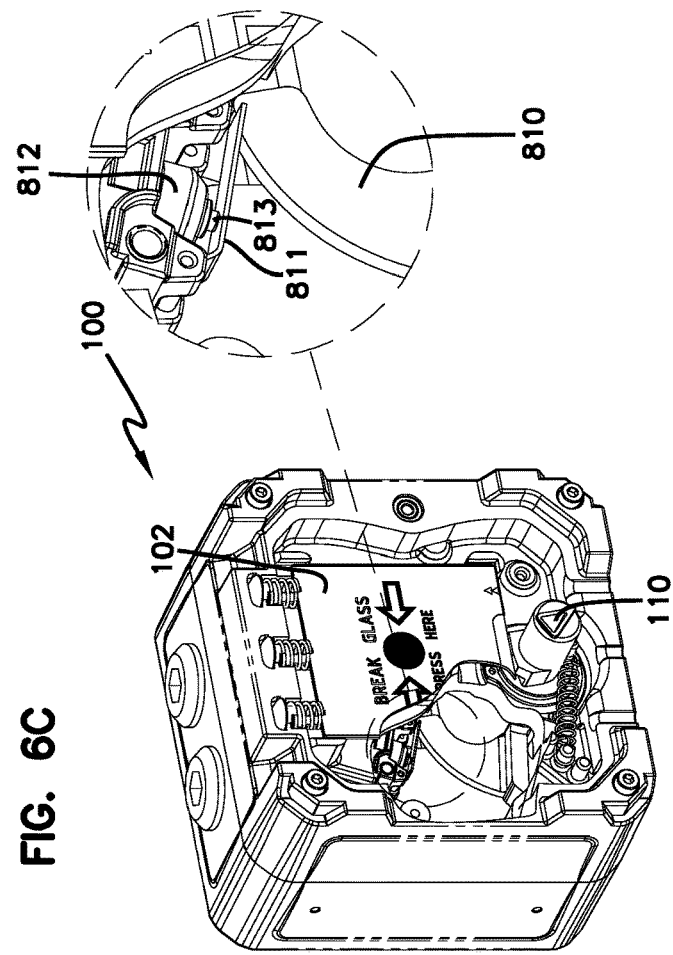
FIG. 6C shows another view of the example station of FIG. 6B with a partial cutaway and enlarged portion.
Figure 6B:
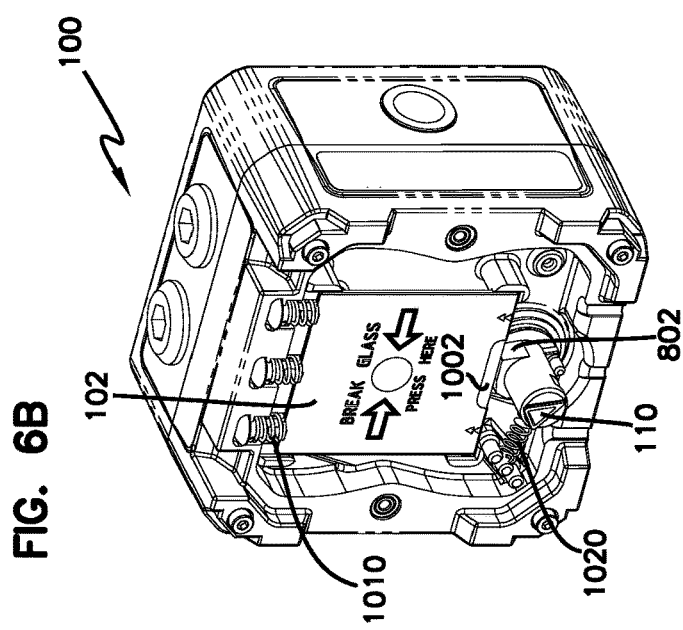
FIG. 6B shows the example station of FIG. 6A with the faceplate removed.
Figure 6E:
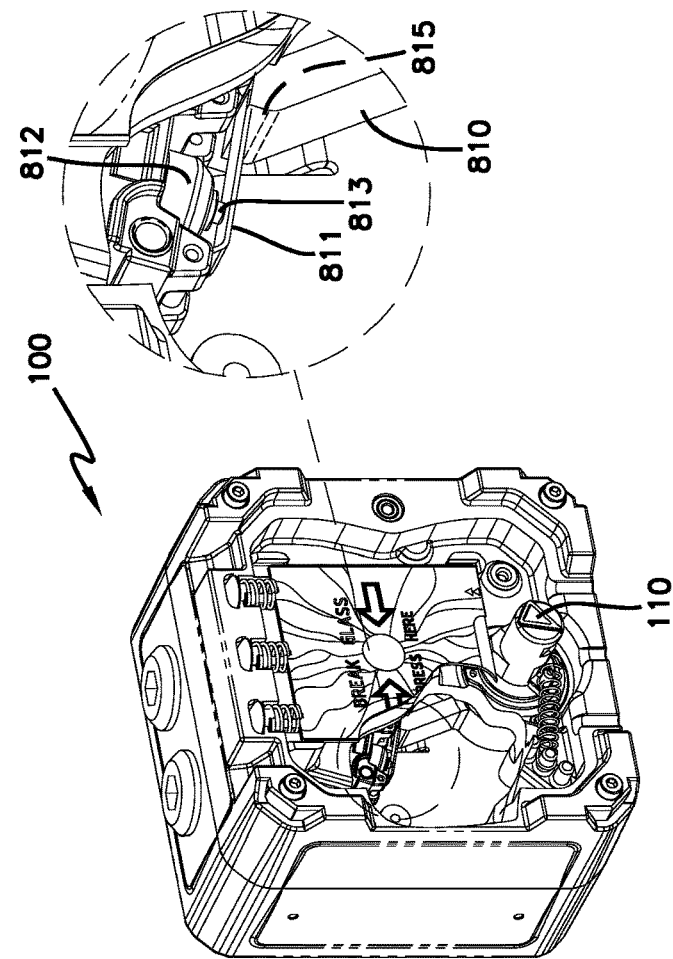
FIG. 6E shows another view of the example station of FIG. 6D with a partial cutaway and enlarged portion.
Figure 6D:
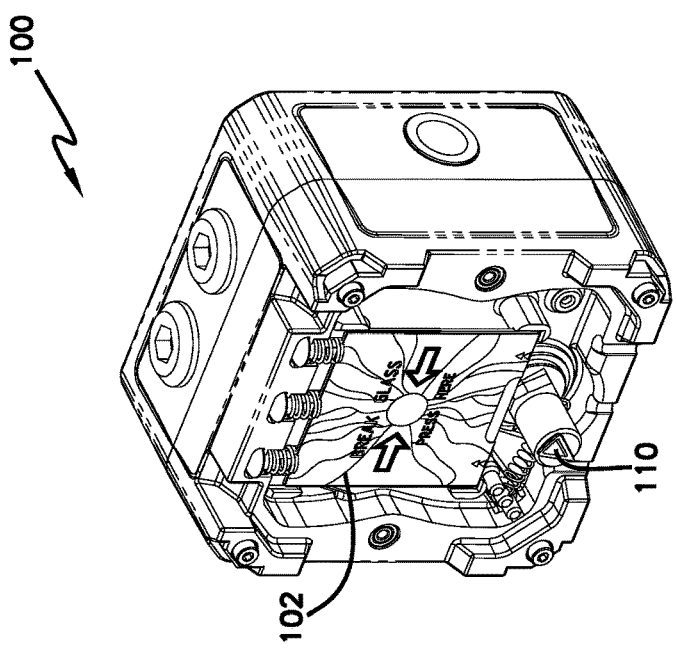
FIG. 6D shows another view of the example station of FIG. 6A with the faceplate removed.
Figure 7:
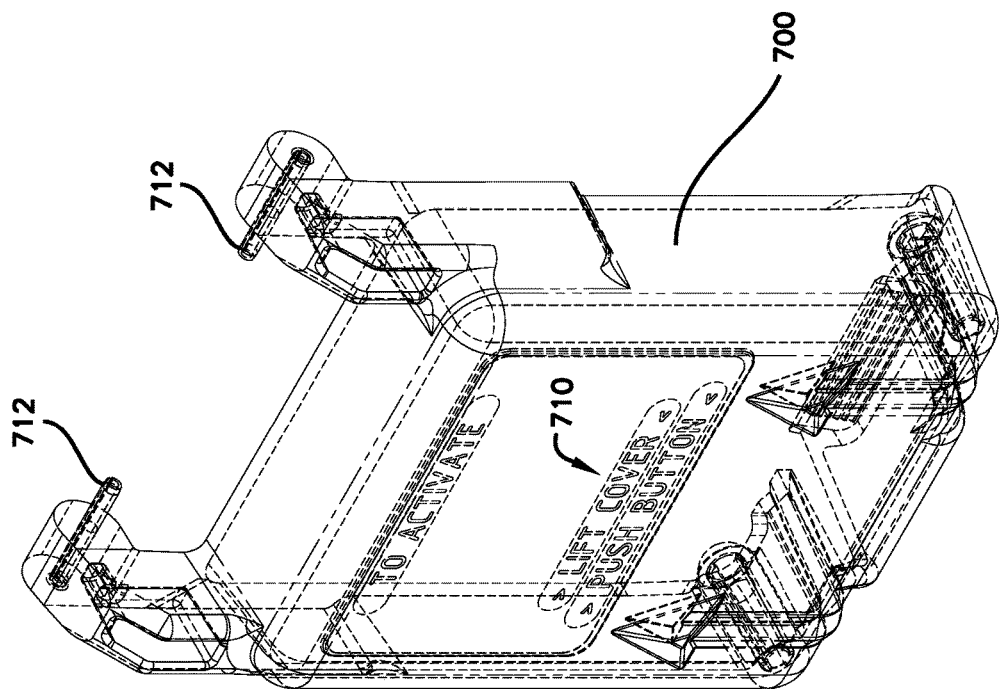
FIG. 7 shows an example cover of the station of FIG. 1.
Figure 8:
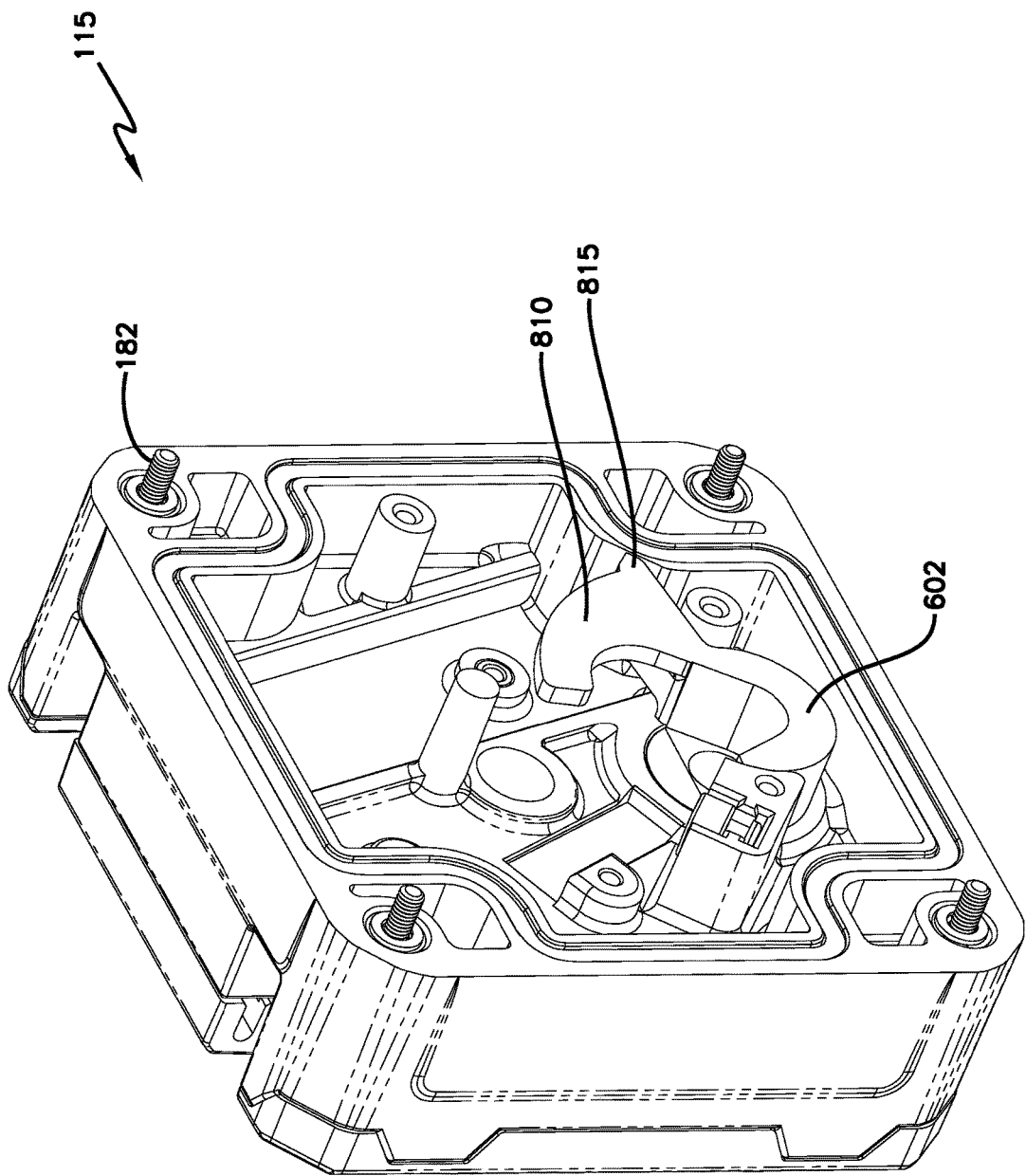
FIG. 8 shows an example front housing of the station of FIG. 1.
Figure 9:
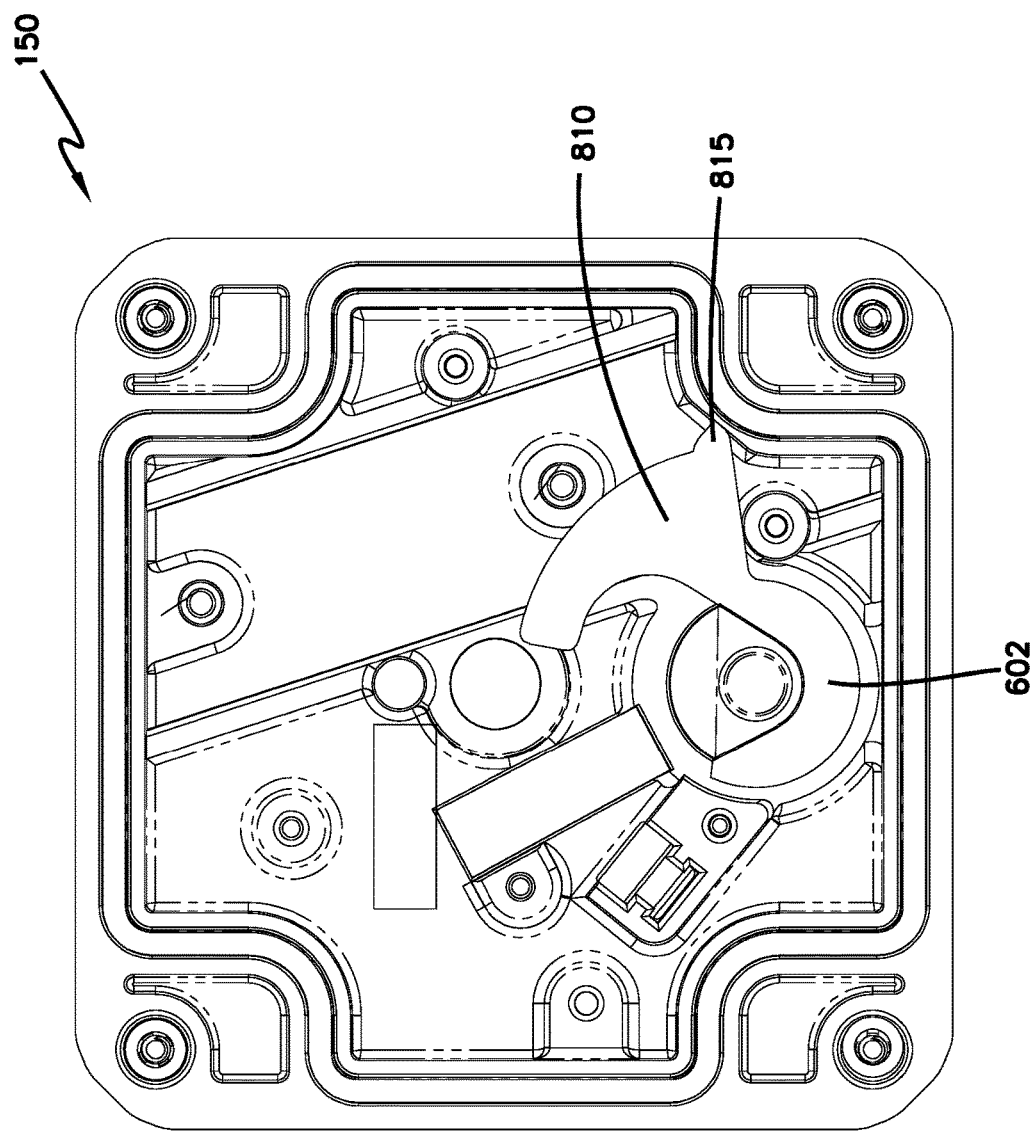
FIG. 9 shows another view of the example front housing of FIG. 8.
Figure 10:
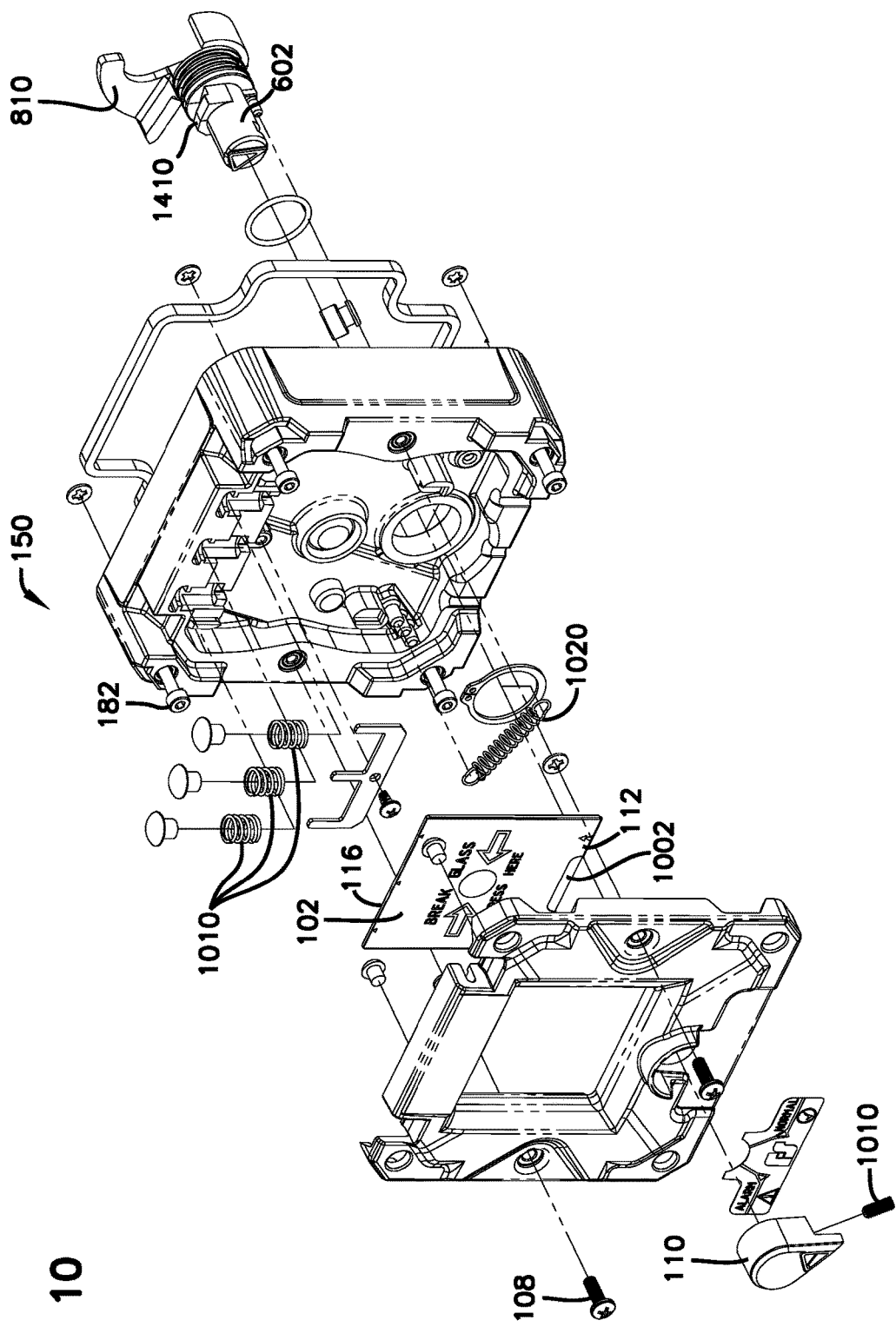
FIG. 10 shows an exploded view of the example front housing of FIG. 8.
Figure 17:
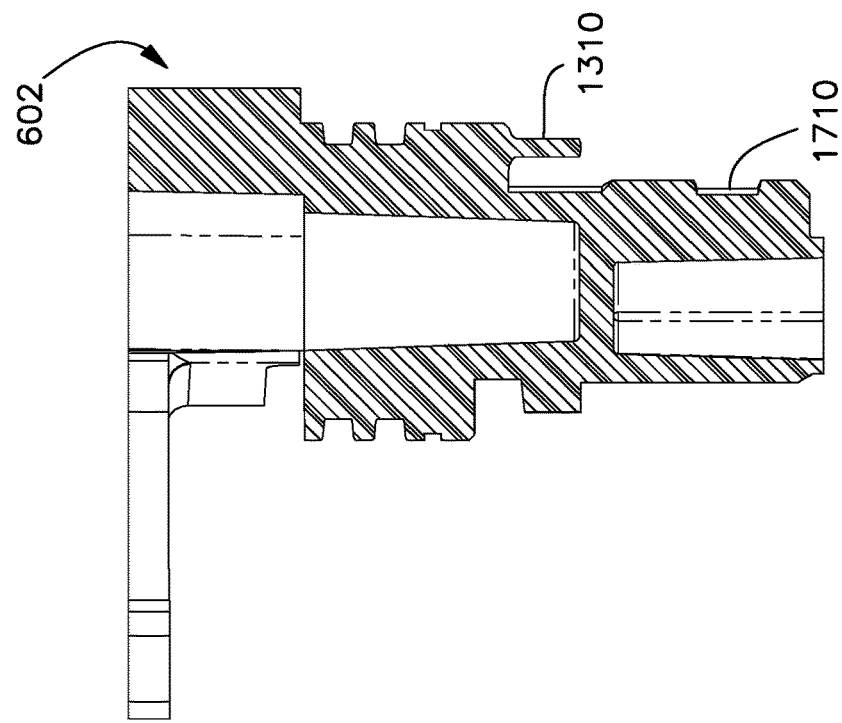
FIG. 17 shows another view of the example actuator cylinder of FIG. 13.
Figure 16:
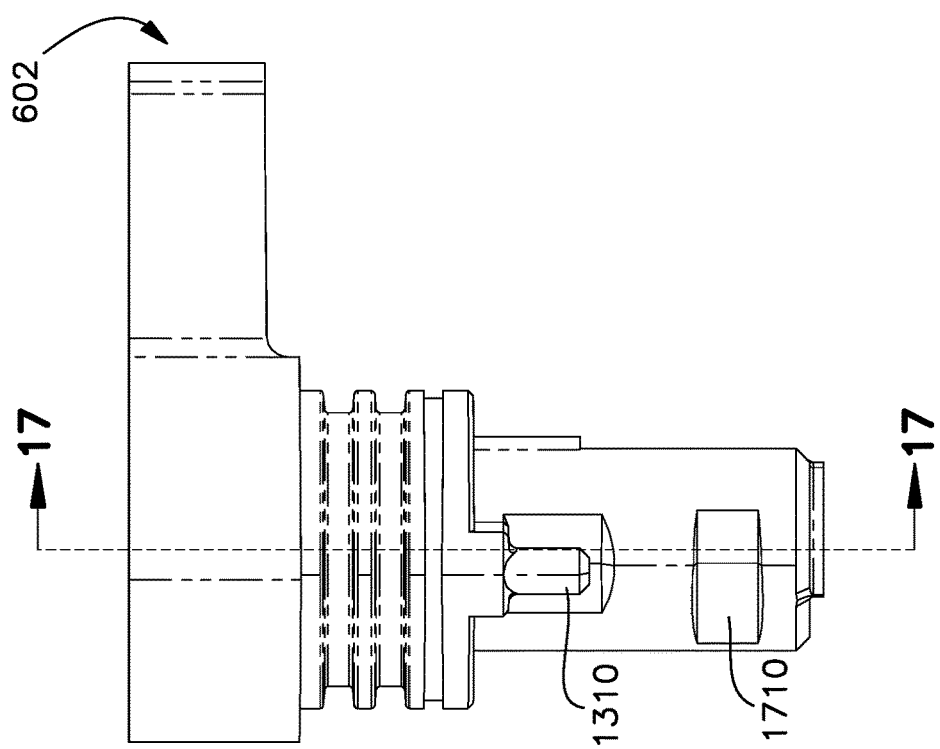
FIG. 16 shows another view of the example actuator cylinder of FIG. 13.
Figure 21:
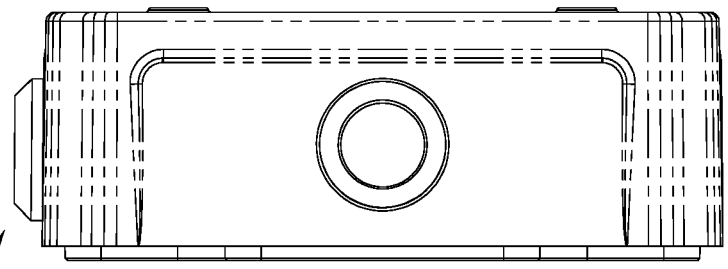
FIG. 21 shows another view of the example rear housing of FIG. 18.
Figure 20:
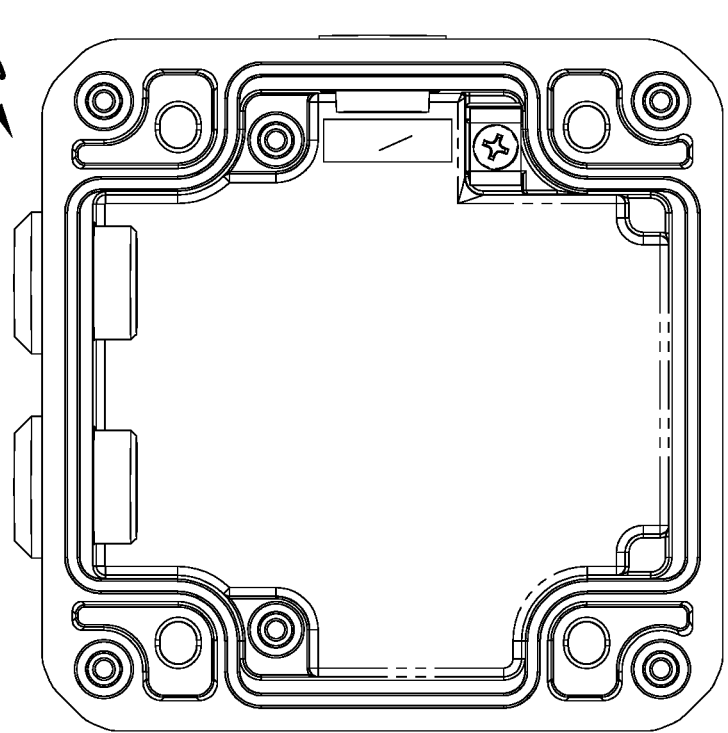
FIG. 20 shows another view of the example rear housing of FIG. 18.
Figure 22:
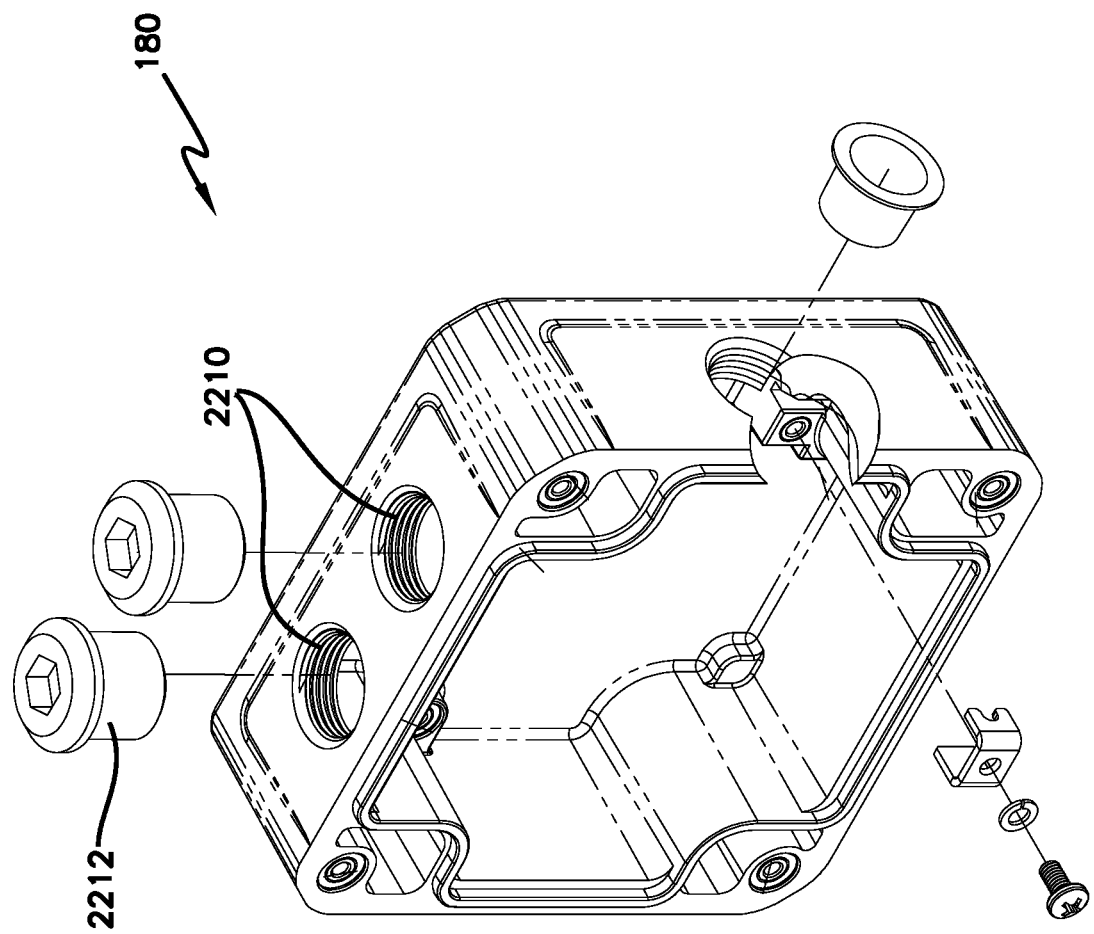
FIG. 22 shows another view of the example rear housing of FIG. 18.

In this example, main activation occurs when a thin glass panel 102 is broken when an external pressure is applied to a noted label decal on the glass panel (e.g., "BREAK GLASS—PRESS HERE"—see label 104 in FIG. 1 and label 710 in FIG. 7). When the glass panel 102 breaks, a spring loaded cam pivot flat surface 602 (which is part of an actuator cylinder 802) originally lodged against a portion 1002 of a lower edge 112 of the glass panel 102 (due to biasing springs 1010 applying a force against said cam surface) is released, turning in a clockwise direction from the operator's point of view. As the actuator cylinder 802 completes a 60-degree clockwise rotation, the actuator cylinder 802 activates a single (or dual optional) switch 812 (see FIGS. 6C and 6E), completing a circuit and sending an alarm notification to the main panel at a remote location.

As shown in FIGS. 6A-6C and 10, the glass panel 102 is held in place against the cam pivot 602 by springs 1010 that engage an upper edge 116 of the glass panel and causes the lower edge 112 of the glass panel 102 to rest upon a flat cam surface feature 1410 of the actuator cylinder 802. Specifically, with an indicator end 118 of a keyway member 110 attached to the actuator cylinder 802 (noting the device is in a normal position state 122), the force of the compression springs 1010 causes the portion 1002 of the glass panel 102 to counteract the force of an extension spring 1020 that forces the actuator cylinder 802 in a clockwise direction (when facing the device). See FIGS. 6B and 6C.

Upon breaking of the glass panel 102, the downward force of the portion 1002 of the glass panel 102 is removed, allowing the actuator cylinder 802 to be rotated by the extension spring 1020 in the clockwise direction (when facing the device) so that the indicator end 118 of the keyway member 110 points to an alarm position 120. As the actuator cylinder 802 rotates in the clockwise direction (when facing the device), a tab 815 on an arm 810 of the actuator cylinder 802 contacts a switch lever arm 811 that actuates the switch 812, causing the alarm state. See FIGS. 6D and 6E.

Referring now to FIGS. 1, 6 and 10-12, the keyway member 110 is removably coupled to the actuator cylinder 802 by a screw 1010 that is threaded through a hole 1210 in the keyway member 110 to engage a groove 1710 formed in the actuator cylinder 802.

To remove a front faceplate 106 of the front housing 150, the screw 1010 is unthreaded from the hole 1210 until an end of the screw 1010 clears the groove 1710 formed in the actuator cylinder. At that point, the keyway member 110 can be slid off the actuator cylinder 802. Two screws 108 can then be removed to allow the front faceplate 106 to be removed, thereby gaining access the internal cavity of the front housing 150. As shown, for example, in FIG. 6, once the front faceplate 106 is removed, the glass panel 102 can be replaced and the actuator cylinder 802 can be reset to the normal position 122.

The actuator cylinder 802 is shown in FIGS. 13-17. As noted, the actuator cylinder 802 extends from the front faceplate 106 to the rear of the front housing 150. The actuator cylinder 802 includes the groove 1710 that engages the key member 110. The actuator cylinder 802 also includes the pivot 602 with the flat cam surface feature 1410 that engages the bottom edge 112 of the glass panel 102. The actuator cylinder 802 further includes a pin member 1310 that is coupled to the spring 1020 to bias the actuator cylinder 802 into the alarm position 120.

At the backside of the front housing 150, shown more in FIGS. 6C, 6E, and 8-9, the arm 810 of the actuator cylinder 802 contacts the switch 812 when the actuator cylinder 802 rotates from the normal position 122 to the alarm position 120. Specifically, when the arm 810 contacts the switch 812, it depresses the switch lever arm 811 which, in turn, depresses a switch plunger 813, causing an internal change of state within the switch 812 of its electrical contact circuit. Various types of switches with different normally open/normally closed contact state configurations may be utilized. Once the switch is activated, a typical alarm circuit would be activated by a monitoring any change of the electrical circuit by a system monitoring panel at a remote location to which the device's switching circuit is wired.

In some examples, a cover 700 is provided to protect the device 100 from accidental activation, as shown in FIGS. 6-7. The cover 700 includes pivot points 712 that engage an opening 610 formed in the front faceplate 106. This allows the cover 700 to cover the opening 620 formed in the front faceplate 106 that allows access to the glass panel 102. When in use, the cover 700 can be pivoted upwards to gain access to the glass panel 102.

FIGS. 1 and 18-23C show the rear housing 180. The rear housing 180 includes openings 2210 through which wires can be run to engage the circuitry positioned in the front housing 150, as described further herein. When not in use, plugs 2212 are used to close the openings 2210. A removable metal mounting bracket with an attached electrical wiring block 2310 is positioned within the rear housing 180 to allow connections between the wires from outside the station 100 and the front housing 150.

With the front housing 150 coupled to the rear housing 180 by screws 182, the station 100 forms a single unit that is sealed from the ambient environment surrounding it.

Referring now to FIGS. 24-27, a second embodiment of a hazardous detection call point station 2400 is shown. The station 2400 is configured in a manner similar to that of the station 100 described above, with the noted differences.

In this example, the main activation occurs when a centrally located button 2402 protruding outwards from a front housing 2450 of the station 2400 has external pressure applied to it. The example button 2402 travels inward approximated 5/16-inch with the pressure. As the push button's stem travels inward, the stem releases the spring-loaded actuator cylinder 802 resting on the stem (in the normal state), and the actuator cylinder 802 is thereupon free to complete a 60-degree clockwise rotation (when facing the device). This rotation activates a single (or dual optional) switch completing a circuit and sending an alarm notification to the main panel at a remote location.

Figure 26:
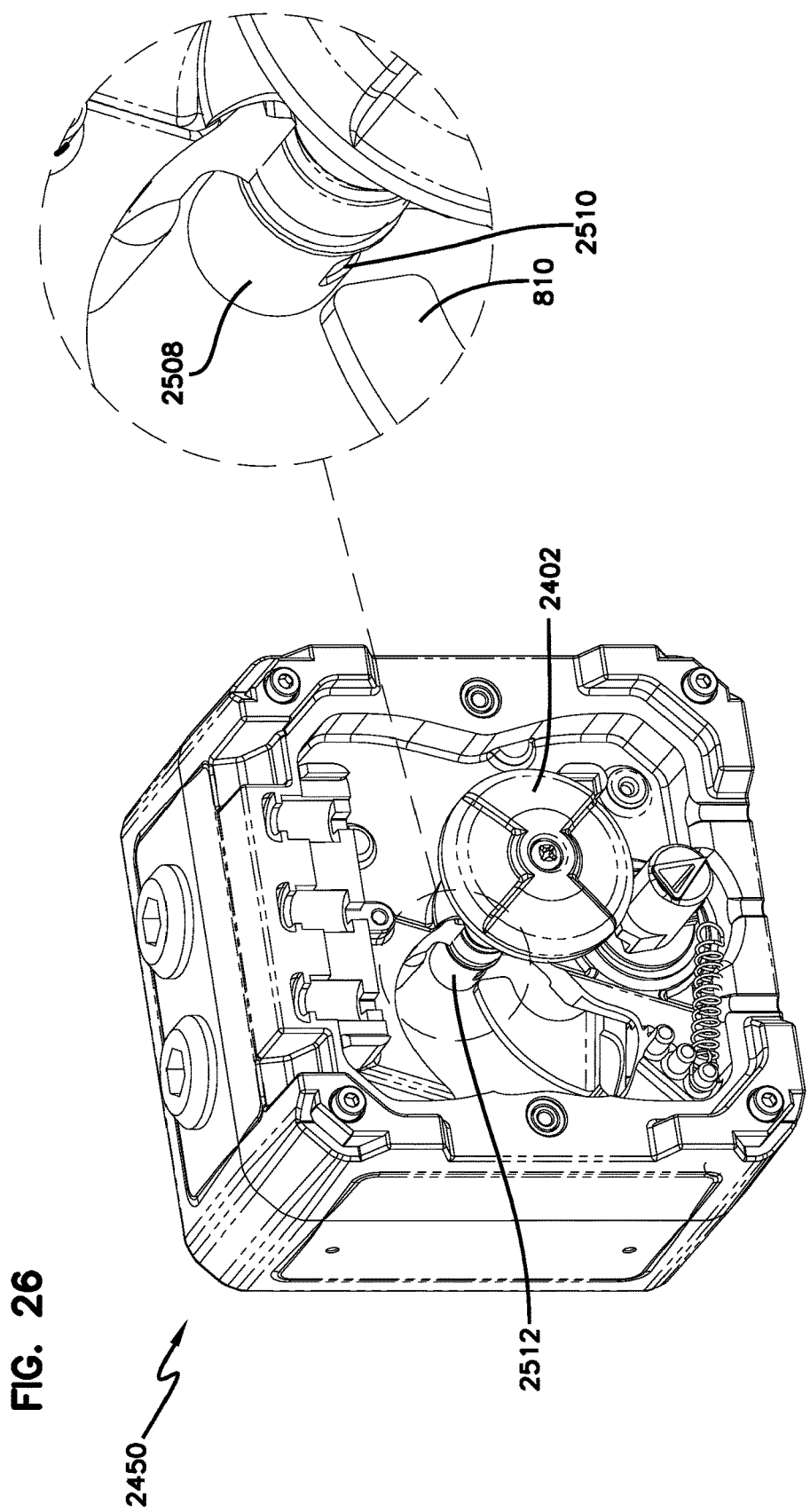
FIG. 26 shows another view of the example station of FIG. 24 with a partial cutaway and enlarged view.
Figure 27:
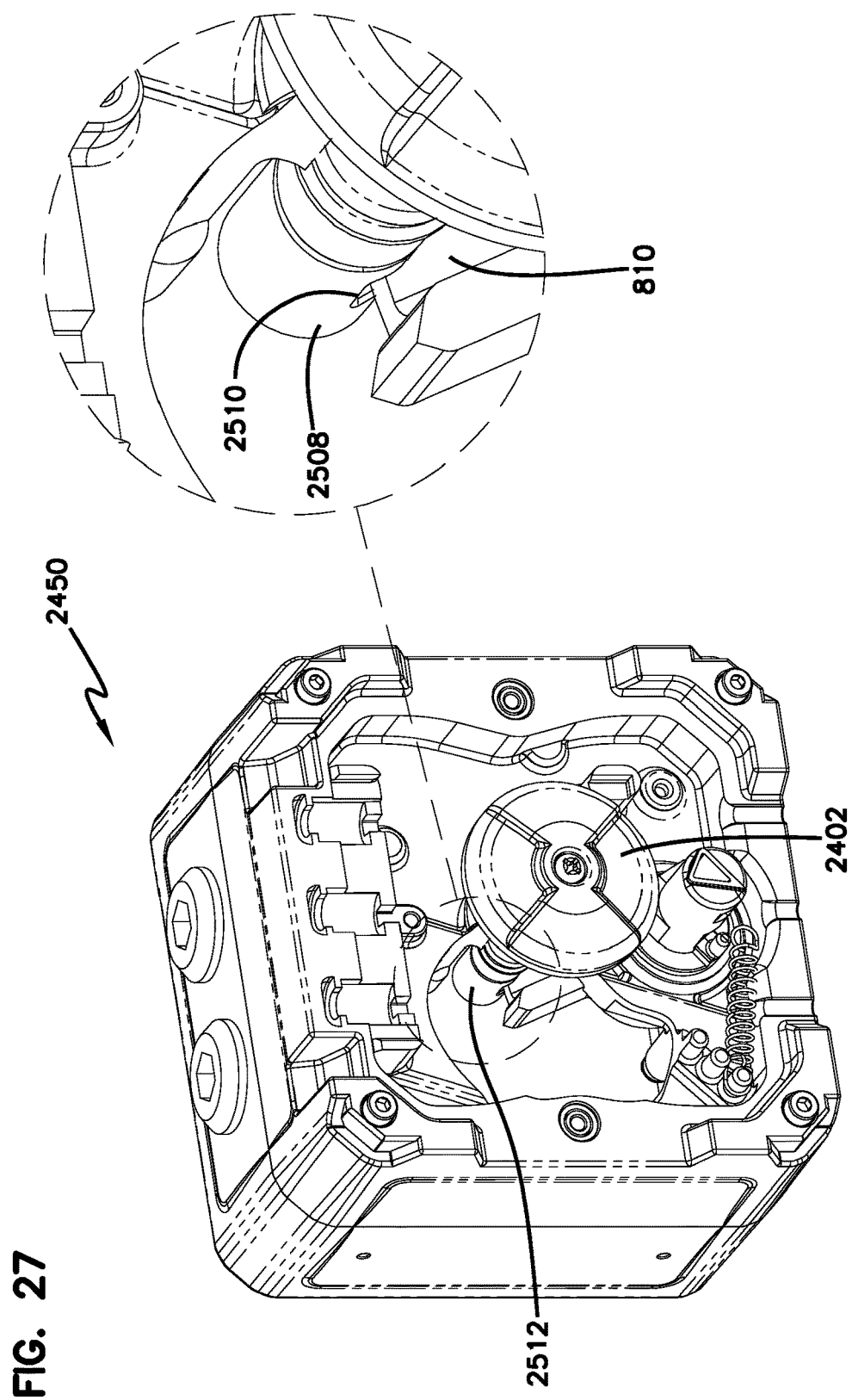
FIG. 27 shows another view of the example station of FIG. 24 with a partial cutaway and enlarged view.

More specifically, the station 2400 includes a stem member 2512 with a front portion 2514 that engages the button 2402. A rear portion 2508 of the stem member 2512 engages the arm 810 of the actuator cylinder 802 to rotationally hold the actuator cylinder 802 in the normal position 122, as shown in FIG. 26. As the button 2402 is pushed rearward, the stem member 2512 moves so that a groove 2510 formed in the rear portion 2508 allows the arm 810 of the actuator cylinder 802 to clear the stem member 2512 through the groove 2510. This thereupon allows the spring 1020 to rotate the actuator cylinder 802 to the alarm position 120, as shown in FIG. 27.

In these examples shown, both embodiments can have a thermoset housing made from a conductive glass reinforced polyester resin. The front faceplate can be custom painted depending on the area of use application for the station. In some examples, the faceplate can be customized in color (e.g., red, yellow, green, blue, and/or black) with a standardized black housing for field application replacement or change of application.

The two sides of the station can include entrance/exit M20 (or possibly ½-inch NPT) threaded walls for incoming/outgoing circuit lines. In an optional design, the rear of the station can include a knockout for acceptance of a ½-inch or M20 wall feed.

There can be one or more advantages associated with the hazardous detection call point stations described herein. For example, a single actuator cylinder can be used in different actuation settings (e.g., the glass break and button press stations 100, 2400 described above). This is accomplished by a different configuration for triggering the actuator cylinder 802 given the different embodiment designs (e.g., using rotary cam point geometry applying pressure to the adjoining glass plate for the station 100, while using adjoining mating of the undercut stem member's movement for the station 2400). This commonality of the actuator cylinder 802 reduces the number of parts while allowing for flexibility in the needs of a given location.

In addition, both the first and second stations 100, 2400 can use common design elements in other areas to enhance these benefits. For example, both embodiments can use a common rear housing (such as the rear housing 180, as shown in FIGS. 18-23C), front housing (such as the front housing 150, as shown in FIGS. 1-17), (and actuator cylinder as noted above). Further, the designs can include the use of dedicated colored faceplates for the different embodiments.

Figure 30:
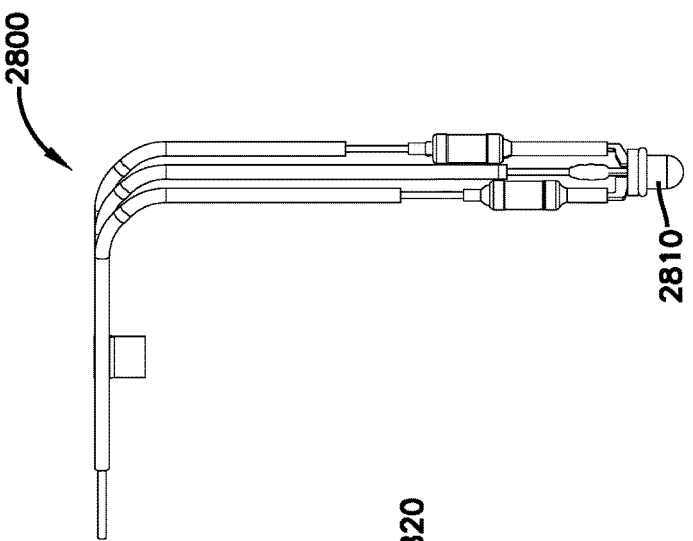
FIG. 30 shows another view of the example light emitting diode module of FIG. 28.
Figure 29:
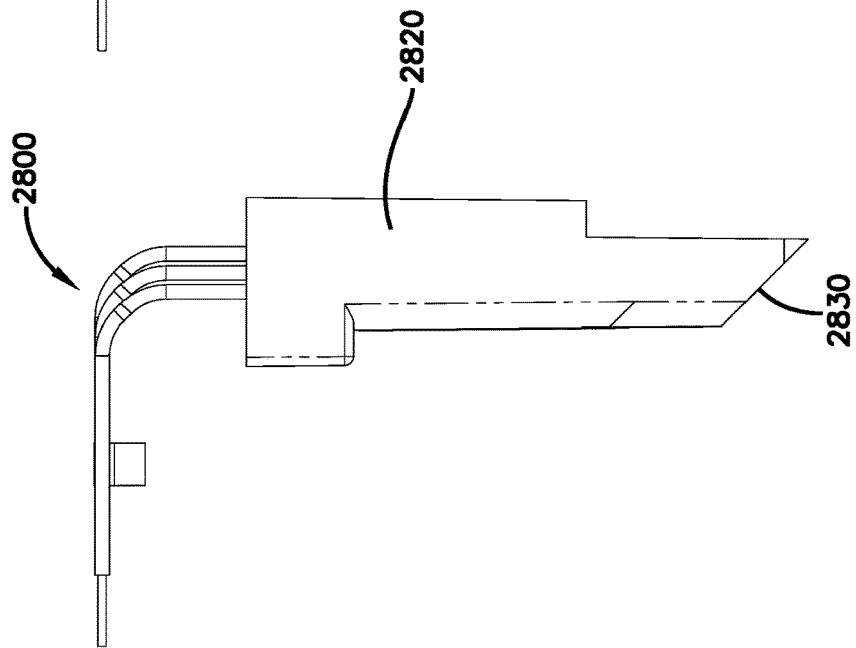
FIG. 29 shows another view of the example light emitting diode module of FIG. 28.
Figure 28:
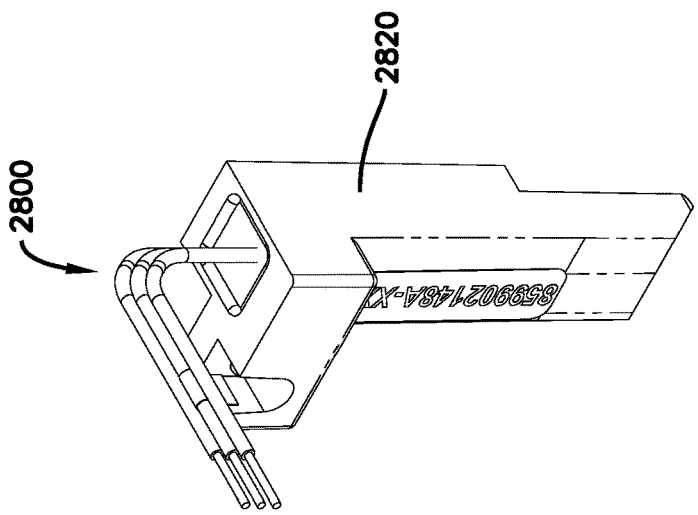
FIG. 28 shows an example light emitting diode module of the example station of FIG. 1.

Further, the actuator cylinder 802 can be made of a clear polycarbonate resin. In this configuration, the actuator cylinder can provide a light causeway for an optional replaceable factory or field installed interior bi-color light emitting diode (LED) status indicator module 2800 with LED light 2810 (normal/green; alarm/red) to be positioned therein for external viewing through the transparent actuator cylinder and keyway member (FIGS. 28-30). This gives a visual cue of the status of the station (i.e., whether the station is in an alarm or normal state from a distance away), or within a lighted or a non-lighted environment rather than inspecting the station close by with a light source present. Within a non-lighted environment, the LED provides a visual cue for locational awareness of the device if needed to be found in an emergency.

In the example shown, the LED light 2810 is potted within a clear polycarbonate housing 2820. The housing 2820 is configured to refract light from the LED light 2810 through a surface 2830 at a 45 degree angle into the actuation cylinder 802. Other configurations are possible.

The LED module equipped station can then also act as a visual indicating device of its status, along with indicating locational presence in non-lighted areas, as well as an initiating device. In some examples, the LED status indicator module can be configured to be powered by various power sources depending on application or need, including: 6, 12, 24, and/or 48 volts DC.

Further, the external geometry feature on the actuator cylinder 802 can provide a visual status indicator (e.g., the indicator end 118) of the stations (normal/alarm).

For the station 2400, the external geometry feature of the hazardous detection call point station can also provide a structure for mating a dedicated design reset keyway/knob covering multiple uses (e.g., by turning the actuator cylinder counterclockwise back to the normal state). In this example, the station 2400 can be reset (i.e., from alarm state back to normal state). The operator can decide whether to attach the reset keyway/knob to the station for general reset use, or use by an administrator to reset the station as a standalone key.

Further, the actuator cylinder 802 for the station 100 can be actuated for testing of the station without breaking glass.

In alternative designs, additional switch(es) can be attached by a movable rail system to provide: adjustability for a variety of switch(es) positioning relative to actuator's travel arm; and positive factory setting adjustment of activation as the switch is mounted directly onto activated cylinder surface.

Figure 31:
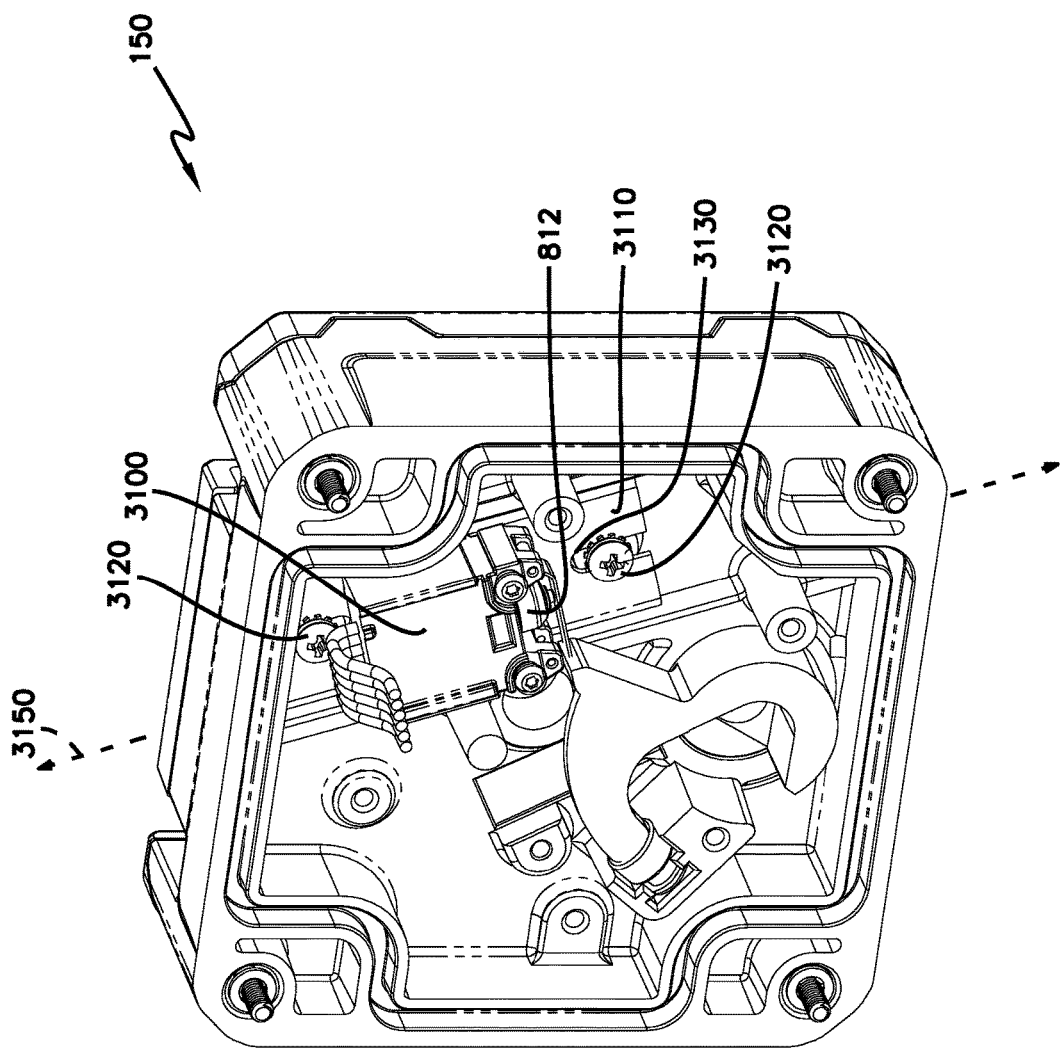
FIG. 31 shows an example rail system for a switch of the example station of FIG. 1.

For example, as shown in FIG. 31, the switch 812 is mounted on a rail 3110 that can be slid in directions 3150, 3150 to align the switch plunger 813 relative to the switch lever arm 811. Openings in the rail 3110 allow for this movement. Two screws 3120 allow the rail 3110 to be fixed to the station 150 at the desired position. Specifically, the screws 3120 holding the rail 3110 with the switch 812 are loosened such that the switch 812 can be positively aligned to the tab 815 of the arm 810 when in the alarm state. In this position, the screws 3120 are tightened in place insuring positive full activation.

This can provide several possible design advantages. For example, one possible advantage is positive alignment to the actuator's arm when in the alarm state, as switches with differing tolerances can vary in activation positioning. This allows the switch to be placed correctly where it is needed for total lever compression, activating the switch's plunger. Another possible advantage is the opportunity to place multiple switch designs from alternate vendors within the station depending on the applications and environments for the station.

Figure 23A:
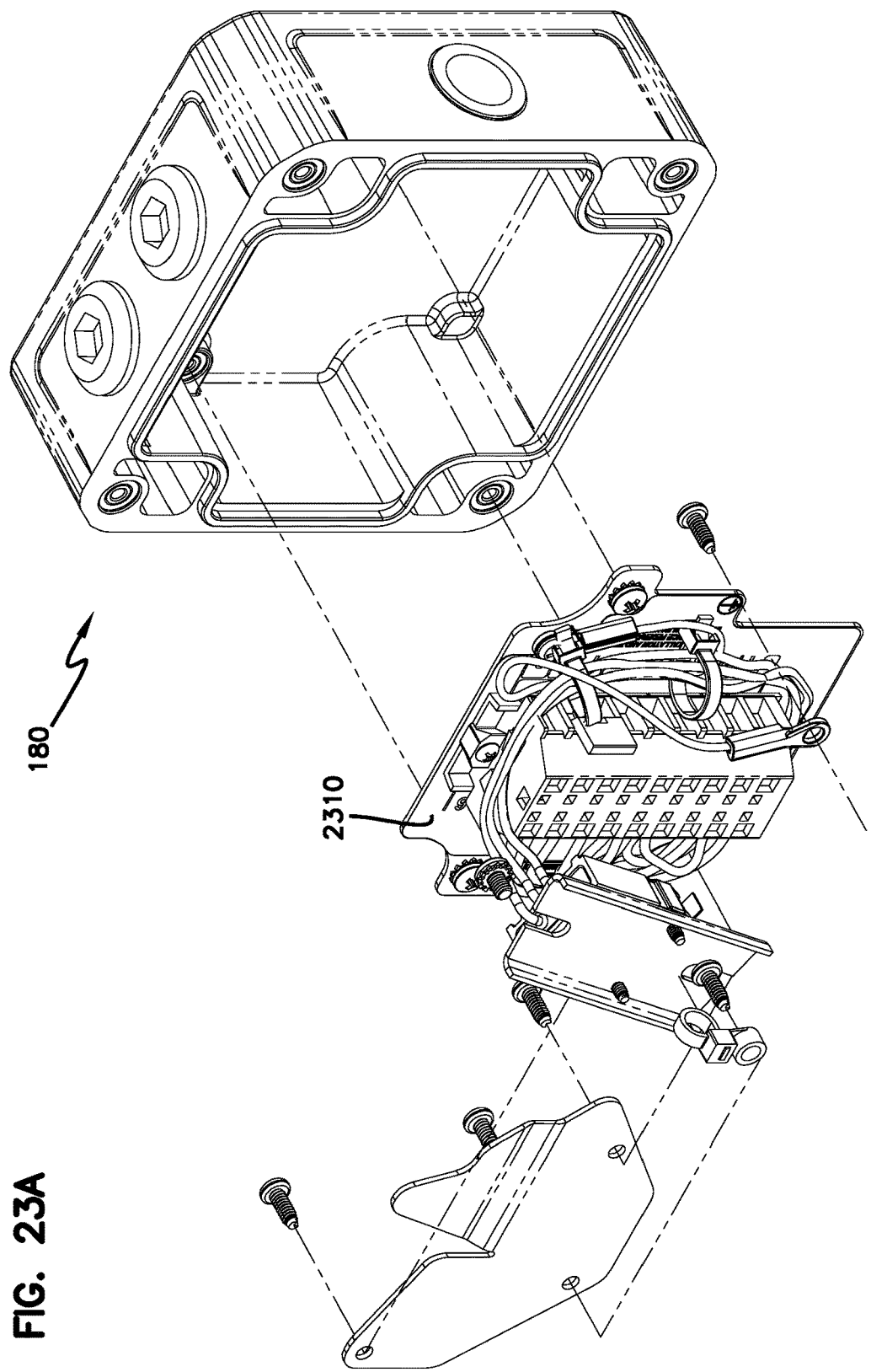
FIG. 23A shows an exploded view of the example rear housing of FIG. 18.
Figure 23C:
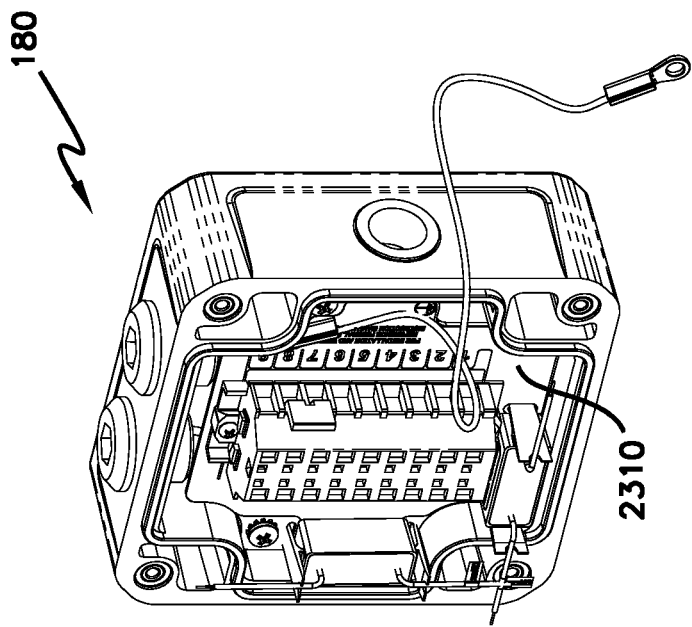
FIG. 23C shows another view of the example rear housing of FIG. 23B.
Figure 23B:
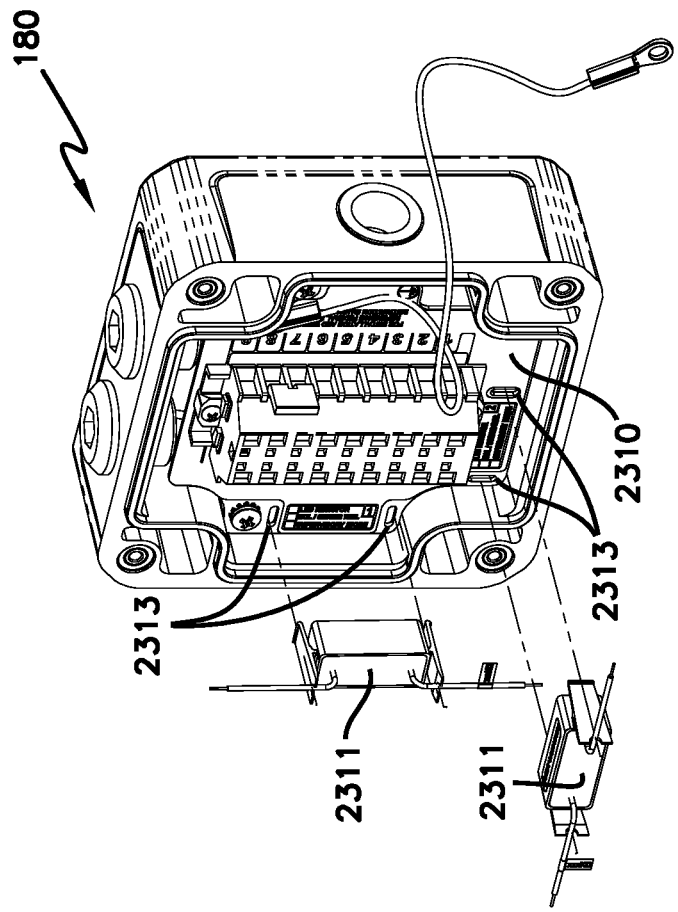
FIG. 23B shows another view of the example rear housing of FIG. 18.
Figure 24:
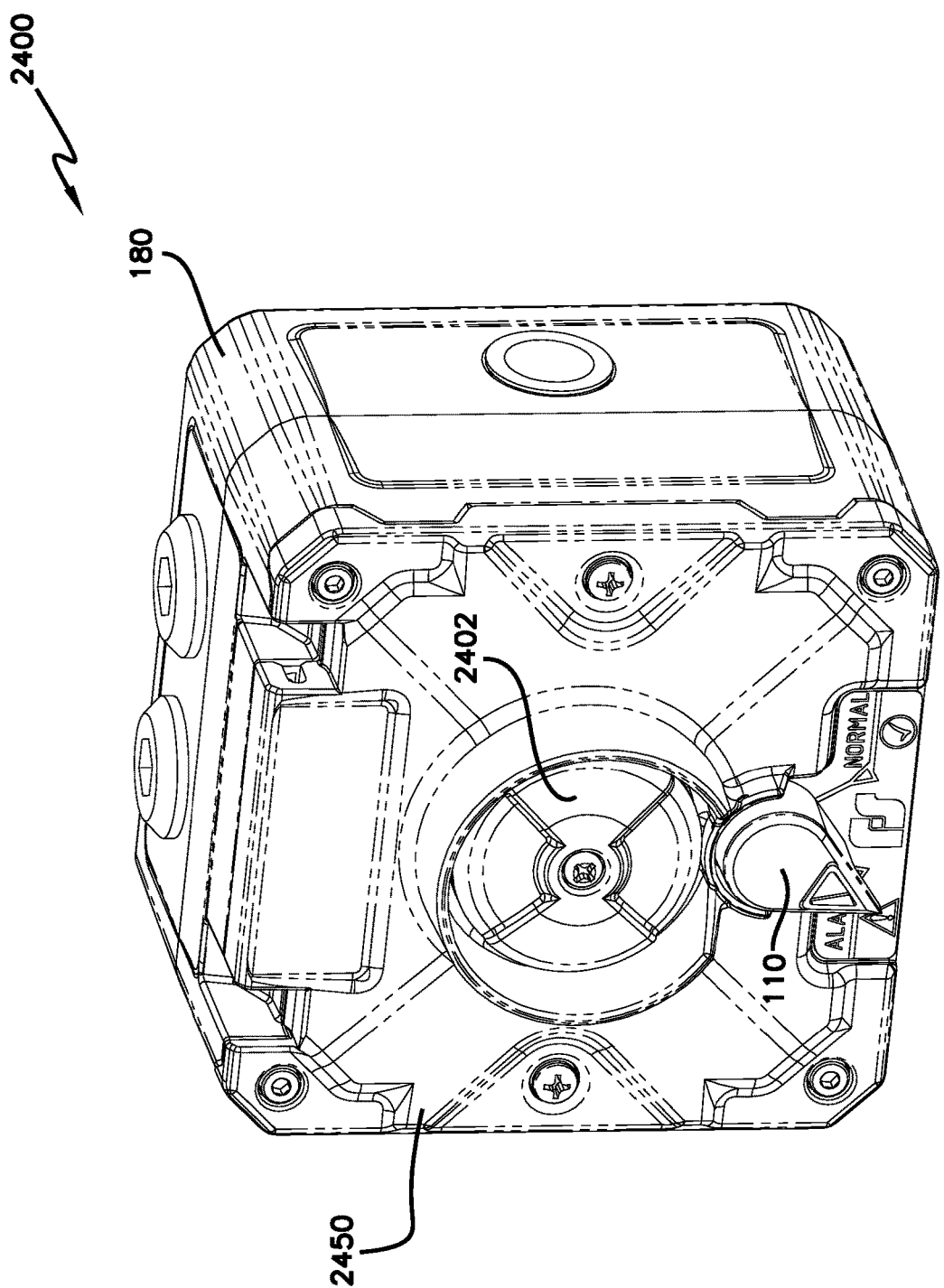
FIG. 24 shows a second example hazardous detection call point station.
Figure 25:
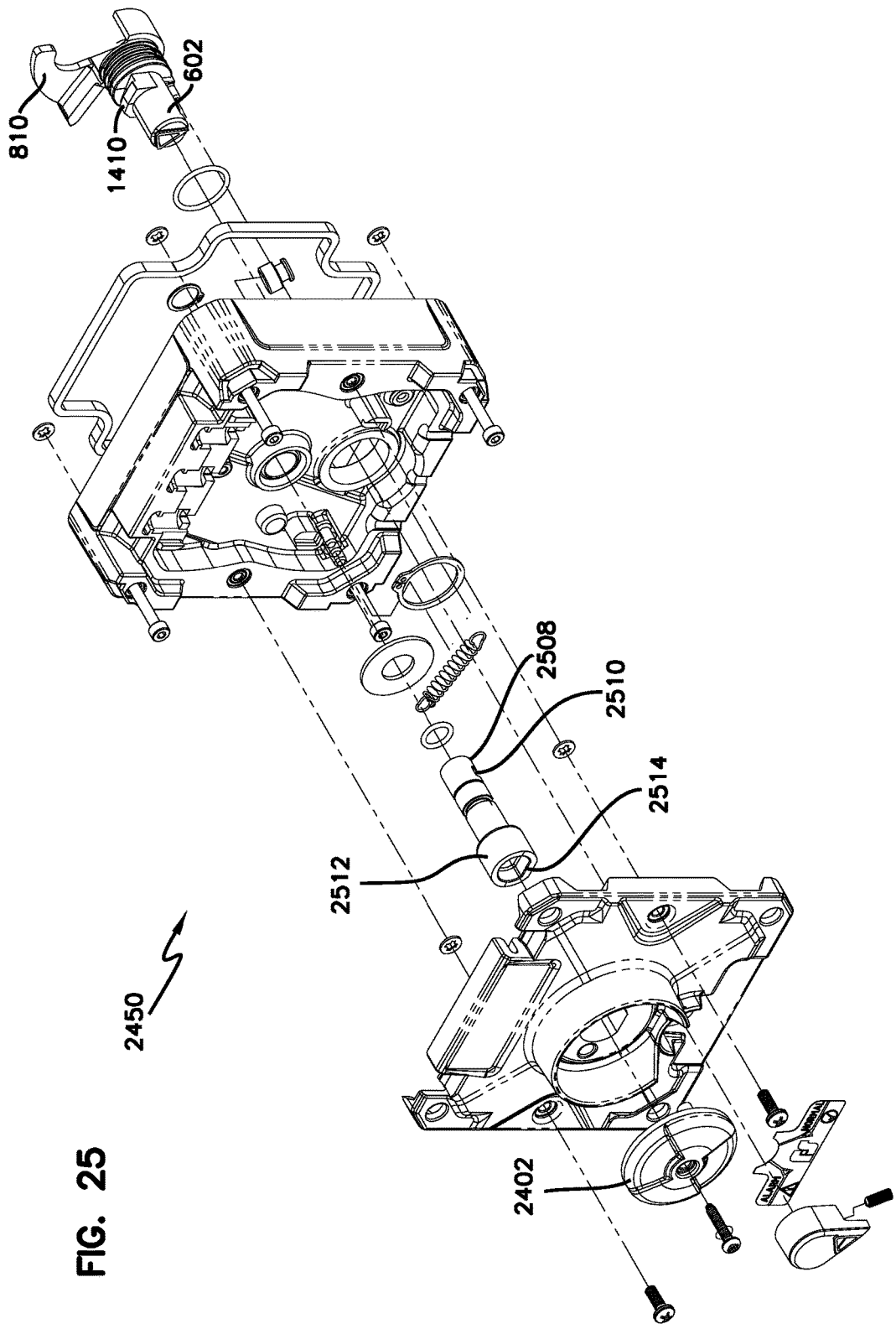
FIG. 25 shows an exploded view of the example station of FIG. 24.

Finally, optional end of line (EOL) resistor and supervisory diode potted devices 2311 (for monitoring line continuity) are included as snap-in devices to openings 2313 in the electrical wiring block 2310 (see FIGS. 23B-23C). This provides latitude in the design to change the values and/or replace just the resistor or diode without removing the entire station from an installation.

Other configurations are possible.

As illustrated, the various embodiments of the hazardous detection call point station can optionally include (but need not if implemented in logical circuitry) at least one central processing unit ("CPU") and a system memory. The memory can provide non-volatile, non-transitory storage for the station. The memory can store instructions that are executed by the CPU. The various embodiments can be networked, as noted above, to a main panel at a remote location for alarming purposes. This network can be wired and/or wireless.

Although various embodiments are described herein, those of ordinary skill in the art will understand that many modifications may be made thereto within the scope of the present disclosure. Accordingly, it is not intended that the scope of the disclosure in any way be limited by the examples provided.

What is claimed is:
1. A hazardous detection call point station, comprising:
a common rear housing;
a front housing, wherein the common rear housing and the front housing are configured to be coupled to form a housing defining an interior; and
an actuator cylinder positioned at least partially within the interior;
wherein, upon breaking a glass front or depressing a button of the station, the actuator cylinder is biased to rotate to complete a circuit and thereby send an alarm notification to a main panel at a remote location; and
wherein the actuator cylinder is common to both the glass front and button of the station.

2. The hazardous detection call point station of claim 1, further comprising at least one first spring to force the glass front against the actuator cylinder to rotationally hold the actuator cylinder in a normal position.

3. The hazardous detection call point station of claim 2, further comprising at least one second spring positioned to rotate the actuator cylinder to an alarm position upon breaking of the glass front.

4. The hazardous detection call point station of claim 1, further comprising a stem member positioned with a front portion adjacent to the button and a rear portion contacting the actuator cylinder to rotationally hold the actuator cylinder in a normal position.

5. The hazardous detection call point station of claim 4, wherein the rear portion of the stem member defines a groove so that, as the button is pressed, the stem member is moved until the groove allows the actuator cylinder to rotate to an alarm position.

6. The hazardous detection call point station of claim 5, further comprising at least one spring to rotate the actuator cylinder from the normal position to the alarm position.

7. The hazardous detection call point station of claim 1, further comprising a key to allow the station to be reset from the alarm position to the normal position.

8. The hazardous detection call point station of claim 1, wherein the rear housing defines a space in which circuitry is positioned, and wherein the rear housing defines one or more opening through which wires are run.

9. The hazardous detection call point station of claim 1, further comprising a multi-color sequencing light to indicate a status of the call point station.

10. The hazardous detection call point station of claim 1, further comprising one or more resistors or diodes electrically potted within a snap-in module.

11. The hazardous detection call point station of claim 1, further comprising a removable faceplate for covering the front housing, the faceplate being colored.

12. The hazardous detection call point station of claim 1, further comprising a movable rail upon which a switch is positioned, the rail being movable relative to the actuator cylinder.

13. A hazardous detection call point station, comprising:
a common rear housing;
a front housing, wherein the common rear housing and the front housing are configured to be coupled to form a housing defining an interior; and
an actuator cylinder positioned at least partially within the interior;
wherein, upon breaking a glass front, the actuator cylinder is biased to rotate to send an alarm notification.

14. The hazardous detection call point station of claim 13, further comprising at least one first spring to force the glass front against the actuator cylinder to rotationally hold the actuator cylinder in a normal position.

15. A hazardous detection call point station, comprising:
a common rear housing;
a front housing, wherein the common rear housing and the front housing are configured to be coupled to form a housing defining an interior;
an actuator cylinder positioned at least partially within the interior;
a button accessible from the front housing; and
a stem member positioned with a front portion adjacent to the button and a rear portion contacting the actuator cylinder to rotationally hold the actuator cylinder in a normal position;
wherein, upon depressing the button of the station, the actuator cylinder is biased to rotate to complete a circuit and thereby send an alarm notification to a main panel at a remote location.

16. The hazardous detection call point station of claim 15, wherein the rear portion of the stem member defines a groove so that, as the button is pressed, the stem member is moved until the groove allows the actuator cylinder to rotate to an alarm position.

17. The hazardous detection call point station of claim 16, further comprising at least one spring to rotate the actuator cylinder from the normal position to the alarm position.

18. The hazardous detection call point station of claim 15, further comprising a key to allow the station to be reset from the alarm position to the normal position.

* * * * *